United States Patent
Yap

(10) Patent No.: US 9,411,722 B2
(45) Date of Patent: Aug. 9, 2016

(54) ASYNCHRONOUS FIFO BUFFER FOR MEMORY ACCESS

(71) Applicant: SanDisk 3D LLC, Milpitas, CA (US)

(72) Inventor: Kian-Chin Alex Yap, Palo Alto, CA (US)

(73) Assignee: SanDisk Technologies LLC, Plano, TX (US)

(*) Notice: Subject to any disclaimer, the term of this patent is extended or adjusted under 35 U.S.C. 154(b) by 205 days.

(21) Appl. No.: 14/193,917

(22) Filed: Feb. 28, 2014

(65) Prior Publication Data

US 2014/0250260 A1 Sep. 4, 2014

Related U.S. Application Data

(60) Provisional application No. 61/772,241, filed on Mar. 4, 2013.

(51) Int. Cl.
| | |
|---|---|
| *G06F 12/02* | (2006.01) |
| *G06F 12/08* | (2016.01) |
| *G11C 7/10* | (2006.01) |
| *G11C 7/22* | (2006.01) |
| *G11C 16/26* | (2006.01) |
| *G11C 16/32* | (2006.01) |

(52) U.S. Cl.
CPC ........ *G06F 12/0246* (2013.01); *G06F 12/0862* (2013.01); *G11C 7/106* (2013.01); *G11C 7/1039* (2013.01); *G11C 7/1057* (2013.01); *G11C 7/1066* (2013.01); *G11C 7/222* (2013.01); *G11C 16/26* (2013.01); *G11C 16/32* (2013.01); *G11C 2207/2272* (2013.01); *G11C 2207/2281* (2013.01)

(58) Field of Classification Search
None
See application file for complete search history.

(56) References Cited

U.S. PATENT DOCUMENTS

| | | | |
|---|---|---|---|
| 4,819,201 A | 4/1989 | Thomas et al. | |
| 4,829,475 A | 5/1989 | Ward et al. | |
| 8,346,201 B2 | 1/2013 | Chen | |
| 8,355,294 B2 | 1/2013 | Makwana et al. | |
| 8,775,701 B1* | 7/2014 | Fung | G06F 13/4243 365/189.011 |
| 2007/0076474 A1* | 4/2007 | Fujisawa | G11C 7/1012 365/185.03 |

(Continued)

FOREIGN PATENT DOCUMENTS

EP 0936619 8/1999

OTHER PUBLICATIONS

Grunzke, Terry (editor), "Open NAND Flash Interface Specification," Revision 3.2, Open Nand Flash Interface (ONFI), Jun. 12, 2013, 310 pages.

(Continued)

*Primary Examiner* — Daniel Tsui
(74) *Attorney, Agent, or Firm* — Vierra Magen Marcus LLP

(57) ABSTRACT

An asynchronous FIFO buffer that provides data in response to requests to read a memory array is disclosed. The asynchronous FIFO buffer provides the data output within a latency tolerance. The asynchronous FIFO has a read clock input and a write clock input. The read clock input receives a read enable signal that defines how data should be clocked out. The write clock input receives a write clock that is asynchronous from the read enable signal. The asynchronous FIFO inputs data from the memory array in accordance with the write clock signal. The asynchronous FIFO outputs data in accordance with the read enable signal. Control logic may pre-fetch data from the memory array into the asynchronous FIFO prior to the read enable signal first being received.

16 Claims, 14 Drawing Sheets

(56) References Cited

U.S. PATENT DOCUMENTS

| | | |
|---|---|---|
| 2008/0068904 A1 | 3/2008 | Hughes |
| 2009/0323728 A1 | 12/2009 | Koutsoures et al. |
| 2010/0174877 A1* | 7/2010 | Yagihashi ................. G06F 5/14 711/155 |
| 2011/0258475 A1 | 10/2011 | Lee |
| 2013/0265826 A1 | 10/2013 | Lee et al. |
| 2013/0318285 A1 | 11/2013 | Pignatelli |
| 2014/0269051 A1* | 9/2014 | Kasorla ................. G11C 16/10 365/185.03 |

OTHER PUBLICATIONS

Forstner, Peter, "FIFO Architecture, Functions, and Applications," Texas Instruments, Nov. 1999, 34 pages.

International Search Report and Written Opinion for PCT/US2014/019736, Int'l Filing Date Mar. 1, 2014, mailed Jun. 4, 2014.

* cited by examiner

ASYNCHRONOUS FIFO BUFFER FOR MEMORY ACCESS

PRIORITY

This application claims priority to U.S. Provisional Application No. 61/772,241, "LOGIC SCHEME TO DECOUPLE SLOW OUTBOUND DDR2 READ DATA," filed on Mar. 4, 2013, which is incorporated herein by reference in its entirety.

BACKGROUND

The present disclosure relates to technology for non-volatile storage.

Advancements in technology have allowed memory devices to increasingly store more data. For example, NAND memory cards can store more data now than ever before. With this comes a need to transfer data in and out of the memory devices at an ever faster rate. However, challenges arise with faster data transfers. In some cases, those challenges are due to meeting timing specifications at a memory device interface.

Timing specification may be provided by industry specifications. The Open NAND Flash Interface Specification, Revision 3.2 (Jun. 12, 2103), which is published by the Open NAND Flash Interface (ONFI) Working Group, is one such example. Such specifications may define pinouts, pad assignments, ball assignments, etc. The pinouts may define, for example, which pin is to be used for a read enable (RE), which pins are to be used for data I/O etc. Likewise, the pad assignments may define pad location, spacing, and usage (e.g., which pad is RE). Note that specifications for other technologies such as NOR may use terms such as output enable (OE) instead of read enable.

Specifications may also define timing parameters for reading data from the memory device for different modes such as single data rate (SDR), double data rate (DDR), quad data rate (QDR), etc. One example timing parameter is the latency between when RE is asserted by the host and data is available from the memory chip on its output pins (or pads). One challenge in meeting latency is that data transfer rates continue to increase. For example, the ONFI 3.2 standard mentioned above extends a non-volatile DDR2 (NV-DDR2) interface from 400 MB/s to 533 MB/s.

As data transfer rates continue to increase, it is becoming more difficult to meet specified timing parameters, such as read latency.

DETAILED DESCRIPTION

Figure 1:
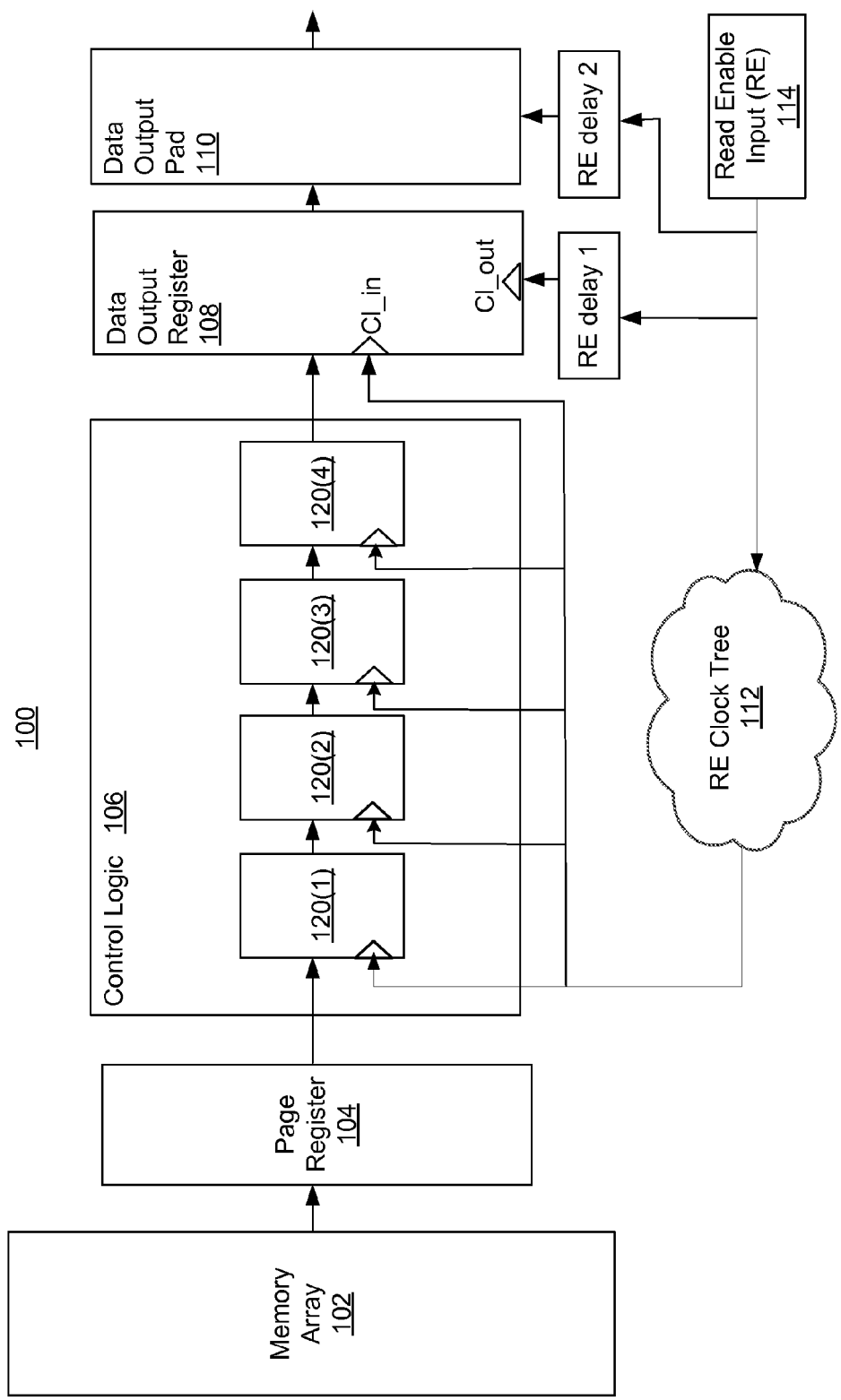
FIG. 1 is a diagram of some elements of a conventional memory device.

FIG. 1 is a diagram of some elements of a conventional memory device 100 to help explain some possible reasons why it may be difficult to meet timing parameters when reading memory devices. The memory device has a memory array 102 that allows data to be written to and read from. The memory array 102 could be implemented with a wide variety of technologies including, but not limited to, 2D NAND, 3D NAND and 3D variable resistive memory (such as ReRAM).

The page register 104 serves to hold data to be written to or read from the memory array 102. The control logic 106 accesses data from the page register 104 and provides it to the data output register 108. The data output register 108 provides the data to the data output pad 110. The data output pad 110 is an externally accessible interface. For example, this could be the interface of a memory chip. The data pad could be implemented as data pads. Instead of data pads, the data could be accessed on external data pins. The data output 110 typically has several pads or pins. For example, there may be 8, 16, 32 or some other number of data pads (or pins).

The read enable input 114 is an externally accessible input. This could be a pad, pin, etc. A read enable (RE) signal is provided on the read enable input to indicate that data should be provided from the memory array 102 onto a data I/O interface. The memory device 100 typically has address pins or pads to provide an address in the memory array 102; however, this is not depicted in FIG. 1.

One challenge with providing the data is to meet timing parameters such as read latency. Read latency may be defined as the time between when RE is active and the data is valid on the data I/O interface. Note that in the conventional design, the RE signal is provided to the control logic via an RE clock tree 112. The RE clock tree 112 refers to a network that distributes the RE signal to various parts of the memory device 100. The RE signal may be provided to several data latches 120(1) that form a pipeline in the control logic 106. A version of the RE signal that is delayed by the clock tree 112 may also be provided to the data output register 108 at Cl_in. This signal may be used to clock data in to the data output register 108.

Note that the data that is accessed from the memory array 102 is moving in one direction, whereas the RE signal that is provided to the control logic 106 via the RE clock tree 112 is moving in the opposite direction. This leads to challenges in synchronizing the RE signal that is provided to various components. Note that RE may be provided at Cl_out of the data output register 108. This RE signal may be used to clock out the data from register 108. However, this RE signal may be ahead of the version of RE that is provided at Cl_in due to delays in the RE clock tree 112, and elsewhere.

One possible way to deal with such problems is to provide signal delays. This is represented by RE delay 1 that is provided for the RE signal provided to the data output register 108 and RE delay 2 that is provided to the data output pad 110. Through the use of technologies such as place and route software, it may be possible to design circuitry with suitable delays such that the data that is provided from the data output pad 110 meets latency specifications. However, as data rates increase, it becomes more challenging to design circuitry that meets latency specifications.

Embodiments disclosed herein provide for an asynchronous first in first out (FIFO) buffer that provides data in response to requests to read a memory array. The asynchronous FIFO buffer of embodiments provides the data output within a latency tolerance. The latency tolerance may be specified by an industry accepted specification. One such specification is the Open NAND Flash Interface Specification, Revision 3.2. However, embodiments are not limited to meeting timing parameters of this particular specification. Also, embodiments are not limited to NAND.

Figure 2:
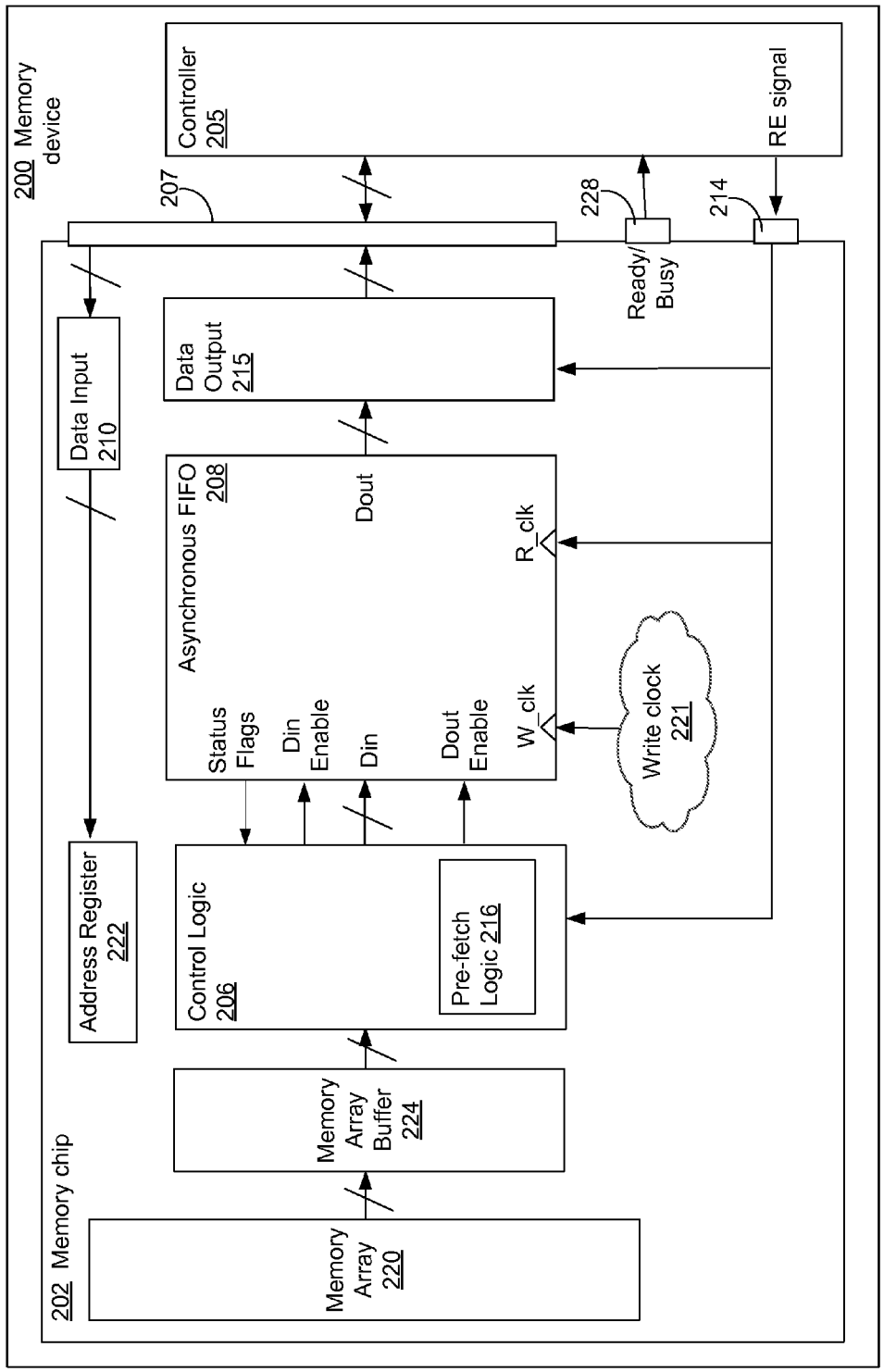
FIG. 2 shows a memory device having an asynchronous FIFO buffer, in accordance with one embodiment.

FIG. 2 shows a memory device 200 having an asynchronous FIFO buffer in accordance with one embodiment. The memory device 200 has a memory die or chip 202. There can be many memory die 202 on a single memory device. In this example, the device 200 has a memory controller 205 that interfaces with the memory die 202. The interface includes a data input/output interface 207, which might be implemented with a number of pins, pads, etc. For example, there might be 8, 16, 32, or some other number of data I/O pins. The data I/O interface 207 may be used to receive data from the controller 205 to be stored in the memory array, to send data that was read from the memory array 220 to the controller 205, to receive commands (e.g., read, write, erase, etc.), and/or to receive an address in the memory array 220 to be written or read. The data I/O interface 207 could interface with an element other than the memory controller 205. For example, the memory controller 205 could be located on the memory chip 202. In this case, the data I/O interface 207 might connect directly to a host device such as a camera, computer, etc. Note that in the example in FIG. 2, the memory device 200 might have another interface (not depicted in FIG. 2) that connects directly to a host device such as a camera, computer, etc.

The memory die 202 typically has many other pins or pads other than the data I/O interface 207. One other possibility is an interface 214 for receiving a read enable (RE) signal. The read enable signal is used for clocking data out of the memory chip 202 onto the data I/O interface 207, in one embodiment. The term "read enable" is used for clarity and is not intended to be limiting. Note that the read enable signal could also be referred to as an output enable (OE) signal. Thus, the term "read enable," as used throughout this description, encompasses the term "output enable."

The memory chip interface also has a ready/busy 228 interface. This allows the memory chip 202 to inform the controller 205 or other host of its status. In one embodiment, there are several (e.g., four or any other number) pins for the ready/busy 228 interface, such that the memory chip 202 can send a separate read/busy signal for different logical units.

Note that the data I/O interface 207, the RE interface 214, and the ready/busy 228 interface may all be compliant with an industry specification (such as, but not limited to, a version of the Open NAND Flash Interface Specification). Thus, the location of pins, pads, etc. is constrained by industry specification, in one embodiment. This constraint can impact the length of data paths, and hence can affect signal delays.

In one embodiment, the data transfer on the data I/O interface 207 is double data rate (DDR). However, other modes including, but not limited to, single data rate (SDR) and quad data rate (QDR) are possible. Note that higher net transfer rates typically associated with DDR and QDR may be more challenging to meet latency.

As will be discussed more fully below, there can be problems with the circuitry on the memory die 202 being able to properly meet timing specifications for clocking the data out to the data I/O interface 207. One such problem is meeting latency requirements with respect to the read enable signal. The memory device 200 has an asynchronous FIFO buffer 208, which helps to solve problems in meeting latency requirements, as well as other problems.

The asynchronous FIFO buffer 208 has a read clock input (R_clk), which may be used to clock data out of the asynchronous FIFO buffer 208 via Dout. The RE signal is provided to the read clock input of the FIFO 208, in this embodiment.

Note that the drawing is not to scale. Moreover, the drawing is not intended to represent all possible delays in data transmission. For example, there may be some delays associated with the lengths of transmission paths. The lengths of these paths are not intended to be represented in FIG. 2. For example, there might be some delay in transmitting the data between the asynchronous FIFO buffer 208 and the data I/O interface 207 due to, for example, the length of the data path.

The asynchronous FIFO buffer 208 has a write clock input (W_clk), which may be used to clock data in to the asynchronous FIFO buffer 208 via Din. A write clock 221 is shown as an input to W_clk. The asynchronous FIFO buffer 208 is designed, in accordance with embodiments, such that the signal provided to R_clk and the signal provided to W_clk do not need to be synchronized. For example, write clock 221 can be asynchronous from RE (provided from RE input 114). In one embodiment. The write clock 221 can be provided in a number of ways. In one embodiment, the write clock 221 is internally generated by, for example, an oscillator. In one embodiment, the write clock 221 is a delayed version of RE that is provided to R_clk. However, these two signals do not need to be synchronized.

The asynchronous FIFO buffer 208 has a Din enable that may be used to enable the input of data at Din. For example, control logic 206 may prevent the asynchronous FIFO buffer 208 from inputting data or allow the asynchronous FIFO buffer 208 to input data (in accordance with W_clk), based on the state of a signal provided to Din enable.

The asynchronous FIFO buffer 208 has a Dout enable that may be used to enable the output of data at Dout. For example, control logic 206 may prevent the asynchronous FIFO buffer 208 from outputting data or allow the asynchronous FIFO buffer 208 to output data (in accordance with R_clk), based on the state of a signal provided to Dout enable. In one embodiment, the width of the interface for Din is the same as the width of the interface for Dout. However, this is not a requirement. The width of the interface for Dout may or may not be the same as the width of the data I/O interface 207.

The asynchronous FIFO buffer 208 outputs data to the data output 215. Data output 215 could be located very close to the data I/O interface 207 physically, and may be referred to as a data output pad, in some cases. However, the asynchronous FIFO buffer 208 is not required to be as close to the data output 215 as physically possible. The width of data that is output by the asynchronous FIFO buffer 208 is not necessarily the same as the width of the data I/O interface 207. One possibility is for the asynchronous FIFO buffer 208 to output 16 bits in parallel. The data output 215 could have a 2:1 MUX to output 8 bits in parallel on the data I/O interface 207. Many other possibilities exist. The data output 215 may receive the RE signal, which it may use when outputting data to data I/O interface 207.

The asynchronous FIFO buffer 208 can be implemented in a variety of ways. In one embodiment, it is implemented as a circular buffer having a read pointer and a write pointer. In one embodiment, data moves through the FIFO buffer 208 sequentially from Din to Dout in a series of storage elements (e.g., registers).

The data input 210 may be logic that is physically close to the data I/O interface 207 to receive data. The data input 210 may provide an address in the memory array 220 to be read to the address register 222. The control logic 206 reads the memory array 220 at the address specified by the received address. One possibility is for the address to specify a page of data. A page can be any size. However, it is possible to have modes of operation in which less than a page is read based on the address specified. In one embodiment, the control logic 206 accesses one page of data from the memory array 220 and transfers it to the memory array buffer 224. In one embodiment, the memory array buffer 224 is referred to as a page register.

The control logic 206 may be located anywhere on the memory chip 202. In one embodiment, at least a portion of the control logic 206 is located physically in a data path between the memory array buffer 224 and the asynchronous FIFO buffer 208. The control logic 206 has pre-fetch logic 216 that pre-fetches data from the memory array buffer 224 and provides it to the asynchronous FIFO buffer 208.

The control logic 206 that is depicted is simplified so as to not obscure the diagram. Control logic 206 may include read/write circuits, which can include multiple sense blocks which allow a page (or other unit) of memory cells to be read or programmed in parallel. The memory array 220 may be addressable by word lines via row decoders and by bit lines via column decoders. The data output 215 may be considered to be part of the control logic 206.

The control logic 206 cooperates with the read/write circuits to perform memory operations on the memory array 220. The control logic 206 may include a state machine, an on-chip address decoder, and a power control module. The state machine provides chip-level control of memory operations. The on-chip address decoder provides an address interface to convert between the address that is used by the host or a memory controller to the hardware address used by the decoders. The power control module controls the power and voltages supplied to the word lines and bit lines during memory operations. Further details of one embodiment of the control logic 206 are shown and discussed with respect to FIG. 17.

Figure 3A:
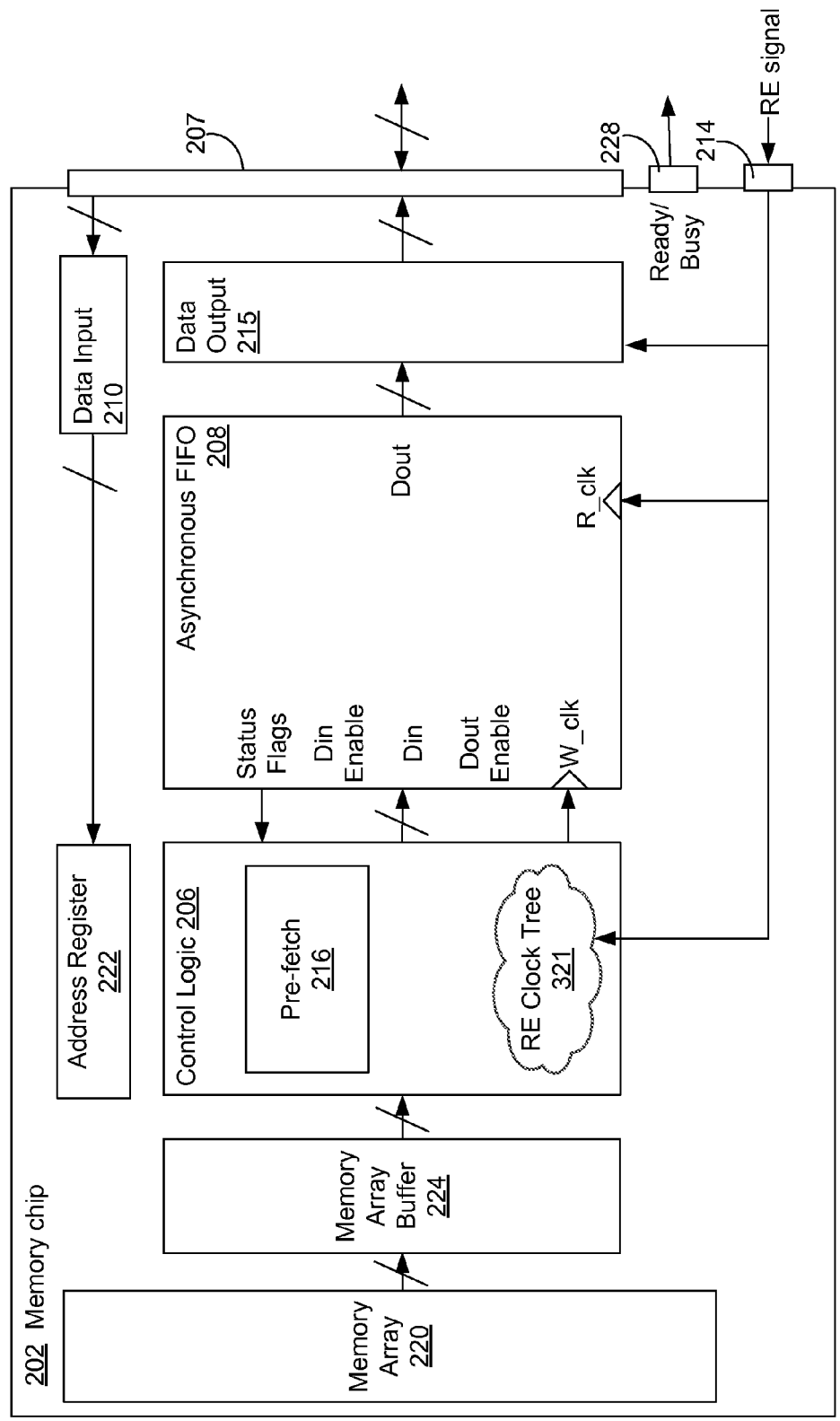
FIG. 3A depicts one embodiment of a memory die having an asynchronous FIFO buffer whose write clock signal is derived from the RE signal.

FIG. 3A depicts one embodiment of a memory die 202 having an asynchronous FIFO buffer 208, in which the write clock signal is derived from the RE signal. The RE signal is provided to the control logic 206. The RE signal is provided to the W_clk input of the asynchronous FIFO buffer 208 via the RE clock tree 321. There may be some delay associated with the RE clock tree 321. There is no need to synchronize the clock signal input at W_clk with the RE signal provided at R_clk. Also, the RE signal provided at R_clk may be a "fast" signal in that there is no need to delay the RE signal to help match it to W_clk.

Figure 3B:
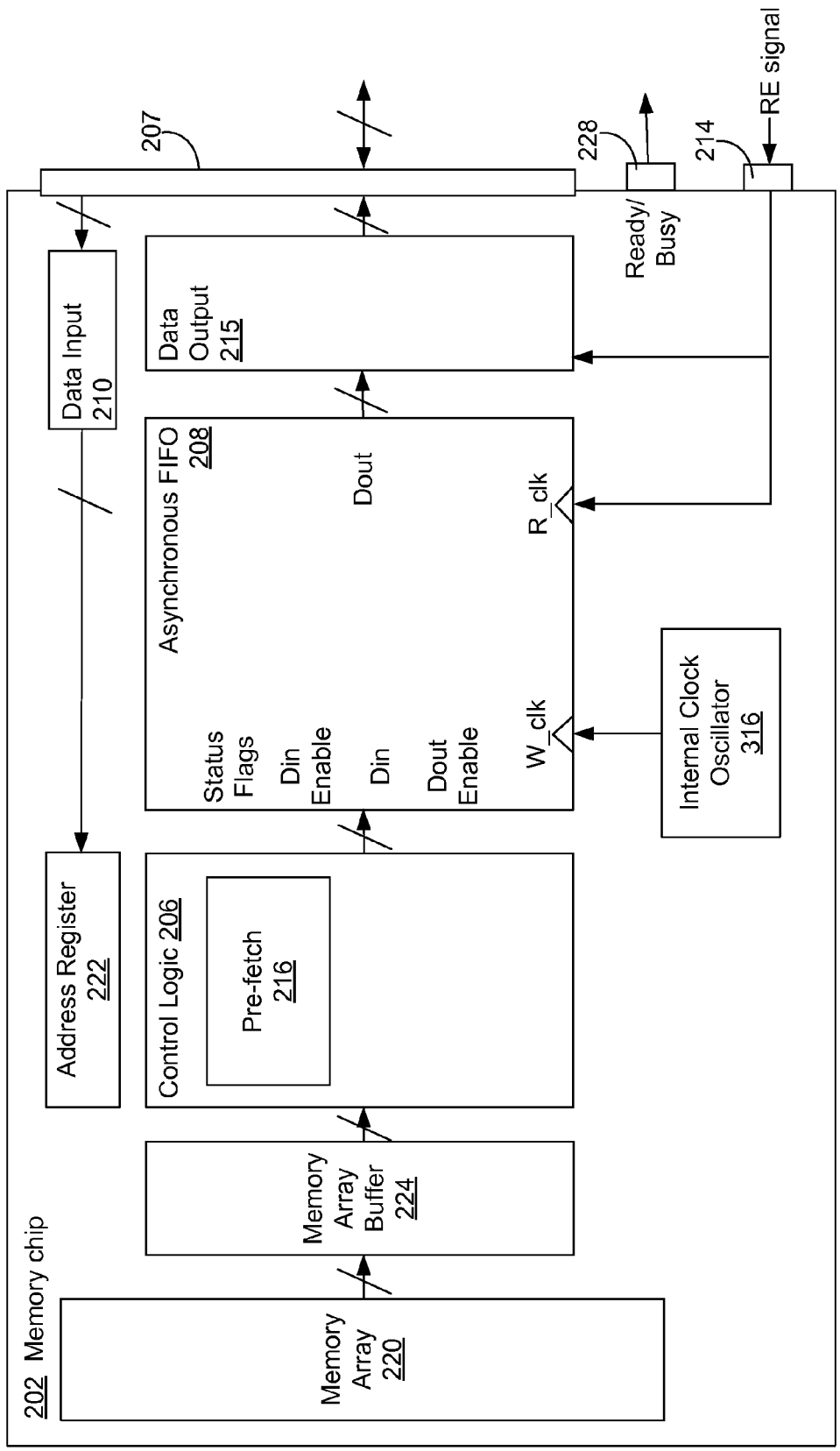
FIG. 3B depicts one embodiment of a memory die having an asynchronous FIFO buffer whose write clock signal is provided by an internal clock oscillator.

FIG. 3B depicts one embodiment of a memory die 202 having an asynchronous FIFO buffer 208, in which the write clock signal is provided by an internal clock oscillator 316. There is no need to synchronize the internal clock signal with the RE signal provided at R_clk. These two clock signals may be completely asynchronous. The RE signal provided at R_clk may be a "fast" signal in that there is no need to delay the RE signal to help match it to W_clk. Also, the frequency of the internal clock oscillator 316 need not be the same as the frequency of the RE signal. In one embodiment, the frequency of the internal clock oscillator 316 is selected to match a frequency of the memory array buffer 224. This will be further discussed below. As one example, the frequency of the internal clock oscillator 316 may be selected to match the fastest frequency at which the memory array buffer 224 operates, which can speed the rate at which the asynchronous FIFO buffer 208 is filled.

Figure 4:
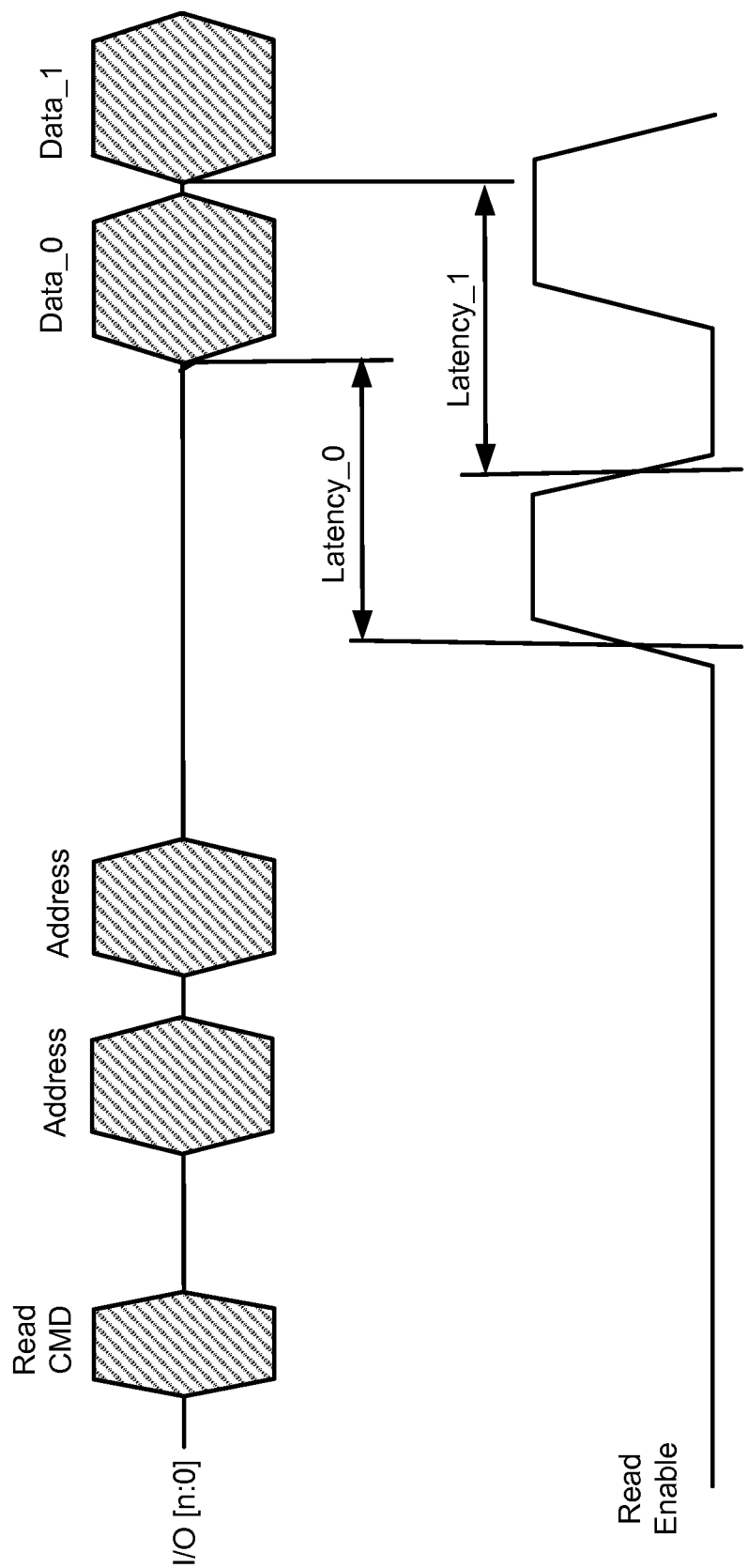
FIG. 4 is a timing diagram of various signals on the interface of one embodiment of the memory device.

FIG. 4 is a timing diagram of various signals on the interface of one embodiment of the memory device 200. Specifically, signals on the data I/O interface 207 and read enable interface 214 are depicted. The data I/O interface 207 could include any number of bits [n:0]. For example, "n" could be 7, 15, etc. The data I/O interface 207 can be used to transfer commands, addresses and data, depending on the present state. The read enable signal is active on both a low to high transaction, as well as a high to low transition, in this example.

The latency is defined as the time between an edge of the read enable and when valid data is to be on the data I/O interface 207. Latency_0 shows the latency between the first rising edge of read enable and Data_0. Latency_1 shows the latency between the first falling edge of read enable and Data_1. In one version of the "Open NAND Flash Interface Specification," the latency is referred to as "$t_{DQSRE}$ for NV-DDR2 mode." Note that embodiments are not limited to NV-DDR2 mode.

Figure 5:
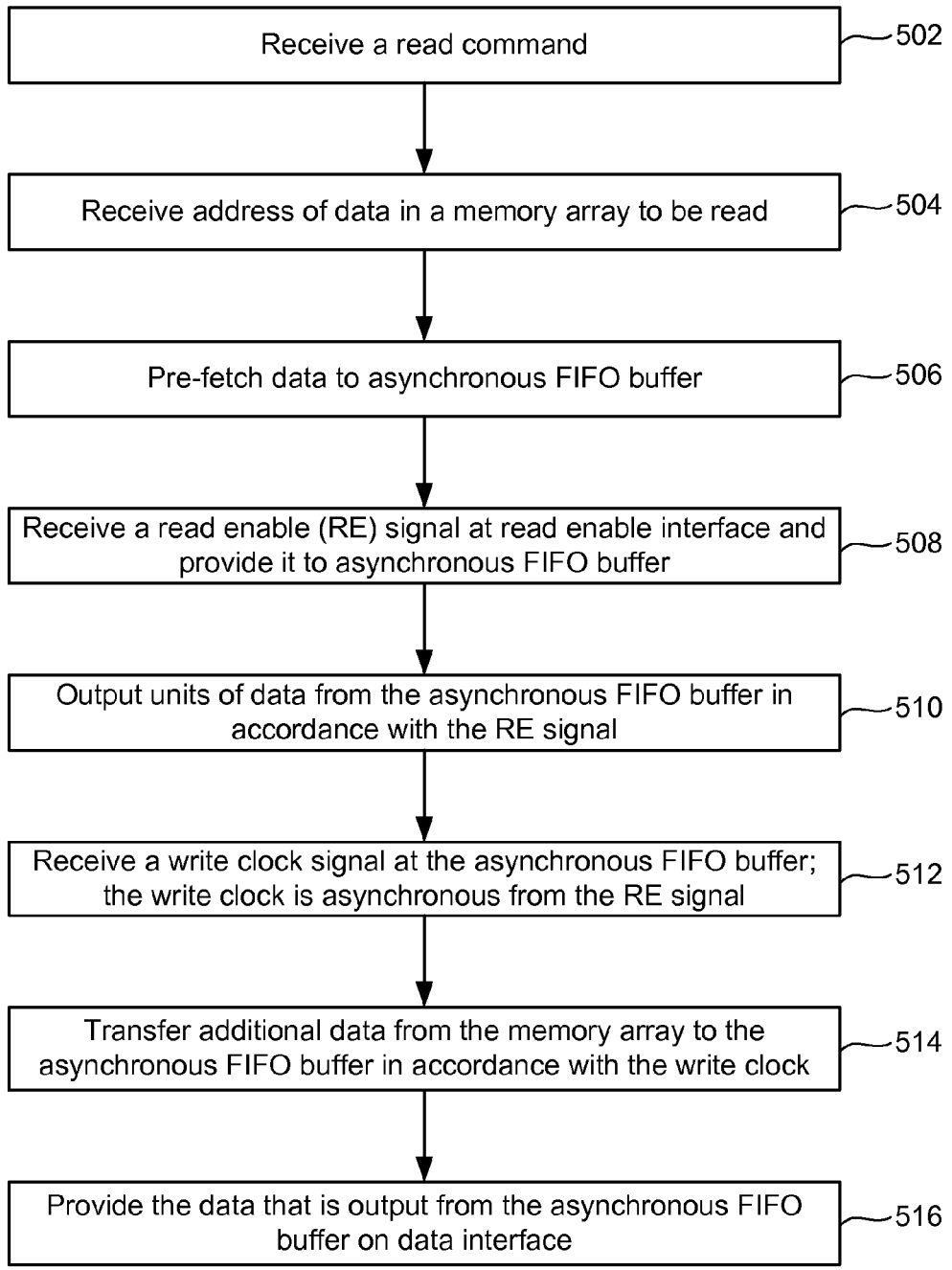
FIG. 5 is a diagram of one embodiment of a process of providing data from non-volatile storage using an asynchronous FIFO buffer.

FIG. 5 is a diagram of one embodiment of a process 500 of providing data from non-volatile storage. The process 500 may be used in any of the memory devices shown in FIG. 2, 3A or 3B, but is not limited to those examples. Steps are described in a certain order as a matter of convenience and may, but are not required to, occur in this order.

In step 502, a read command is received. In one embodiment, the command is received at the data I/O interface 207 (See FIG. 4, as one example). Thus, step 402 may include the command being provided to the memory die 202. The command may be provided by the controller 205, or some other entity.

In step 504, an address of data to be read from the memory device 200 is received. In one embodiment, the address is received at the data I/O interface 207. Thus, step 504 may include the address being provided to the memory die 202. This address may specify a page of data to read, but is not limited to reading a page. A page of data can be any size. The number of bits in the address may exceed the width of the data I/O interface 207. Thus, the address may be provided in more than one piece. FIG. 4 shows the address being provided in two pieces, but this is just for illustration. As another example, a column address could be provided in two pieces and a row address could be provided in three pieces, for a total of five. There are many other possibilities. The address may be stored in the address register 222.

Figure 6:
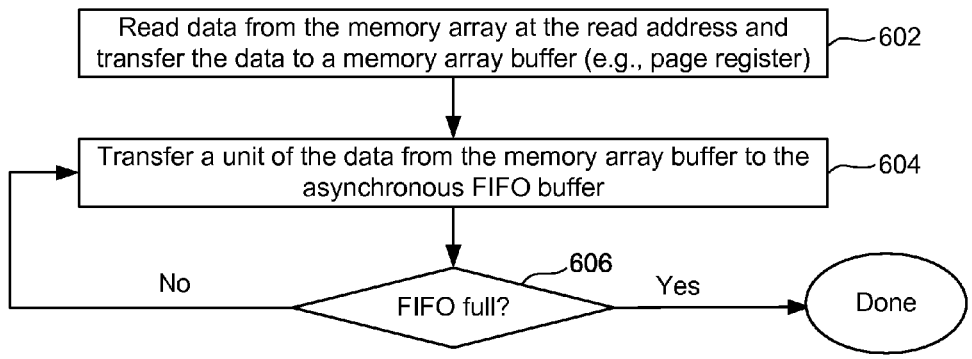
FIG. 6 is one embodiment of a flowchart of a process of pre-fetching data into an asynchronous FIFO buffer.

In step 506, data is pre-fetched into the asynchronous FIFO buffer 208. This "pre-fetching" refers to transferring data from the memory array 220 to the asynchronous FIFO buffer 208 prior to a read enable signal being received at the read enable input 114. Thus, step 506 may include circuitry on the memory die 202 pre-fetching data into the asynchronous FIFO buffer 208 prior to the memory die 202 receiving the read enable signal. FIG. 6 provides details of one embodiment of pre-fetching data.

In step 508, the read enable (RE) signal is received at the read enable interface 214. The read enable signal defines how data to be read from the memory array should be clocked out of the non-volatile storage device on the data I/O interface 207. The read enable signal is a signal that is used to clock the data out onto the data I/O interface 207, in one embodiment. Thus, the read enable signal may be a clock signal that comprises numerous falling and rising edges. The read enable signal is received at the read enable interface 214 after both the read command and the address to be read are received on the data I/O interface 207, in one embodiment. In step 508, the read enable signal is provided to the asynchronous FIFO buffer 208. For example, it is provided to the read clock input (R_clk).

FIG. 4 shows a small portion of one example read enable signal. The read enable signal follows (and is associated with) a read command and an address to be read, in one embodiment. The RE signal may continue on for many more cycles. In the example, both the rising and falling edge indicate that data should be output to I/O interface 207. However, only the rising edge or only the falling edge might be used, as two other possibilities. Also note that Quad Data Rate is another possibility. Note that the term "receiving the read enable signal" refers to receiving a signal on the read enable interface 214 that indicates how data should be output onto the I/O interface 207. Thus, step 508 is not referring to receiving the flat (unchanging) signal that is received at the read enable interface 207, for example, when the read command and address are received in FIG. 4.

In step 510, units of data are output from the asynchronous FIFO buffer 208 in accordance with the read enable signal. Note that the number of bits (in parallel) from the asynchronous FIFO 208 may or may not match the width of the data I/O interface 207. Thus, note that the asynchronous FIFO buffer 208 might, but is not required to, output a unit of data for each unit that is expected on the data I/O interface. Referring to FIG. 4, Data_0 and Data_1 might each be 8 bits. The asynchronous FIFO buffer 208 might output data in units of 16 bits, as one example. Thus, asynchronous FIFO buffer 208 is not required to output a unit of data for both the rising and falling edge of the RE enable signal (for DDR), although this is one possibility. Step 516 provides further details.

Note that the asynchronous FIFO buffer 208 has a D_out enable in one embodiment. Thus, in step 510, the asynchronous FIFO buffer 208 might suspend outputting of data if D_out is not enabled. Further details are discussed below.

In step 512, a write clock signal is provided to the asynchronous FIFO buffer 208. The write clock signal is asynchronous from the signal provided at the read clock input of the asynchronous FIFO buffer 208, in one embodiment. In one embodiment, the write clock signal is a delayed version of the read enable signal. In one embodiment, the write clock signal is provided by an oscillator 316 within the memory device 200.

In step 514, additional data is transferred from the memory array 220 to the asynchronous FIFO buffer 208 in accordance with the write clock signal. Note that the data may first be transferred to the memory array buffer 224. Also, the data may pass through a portion of control logic 206 on its way to the asynchronous FIFO buffer 208.

In step 516, data that is output from the asynchronous FIFO buffer 208 is provided on the data I/O interface 207. This step may include moving data into the data output 215, and then onto the data I/O interface 207. This movement may be under the direction of control logic 206. As noted above, the control logic 206 is intended to refer to logic in various places on the memory chip 202.

To help illustrate step 516, two DDR examples will be discussed with reference to FIG. 4, in which data is expected on the data I/O interface 207 for both a rising and a falling edge or RE signal. First, consider an example in which the data I/O interface 207 is 8 bits and the asynchronous FIFO buffer 208 outputs units of 8 bits. A unit of data (e.g., 8 bits) may be provided by the asynchronous FIFO buffer 208 for both the falling and rising edge of the RE signal. This may be input to the data output 215 and then onto the data I/O interface 207. Next, consider an example in which the data I/O interface 207 is 8 bits and the asynchronous FIFO buffer 208 outputs units of 16 bits. A unit of data (e.g., 16 bits) may be provided to the data output 215 by the asynchronous FIFO buffer 208 for just one of the falling or rising edge of the RE signal. The data output 215 might split this 16 bits to provide 8 bits at a time. Note that in both of these examples the asynchronous FIFO buffer 208 outputs data in accordance with the RE signal. Also, latency requirements are met. Many other possibilities exist.

FIG. 6 is one embodiment of a flowchart of a process 600 of pre-fetching data. This is one embodiment of step 506. In step 602, data is read from the memory array 220 and transferred to the memory array buffer 224. In one embodiment, memory array buffer 224 is referred to as a page register. In one embodiment, control logic 206 performs step 602. The control logic 206 may receive a read command, followed by a read address (see FIG. 4).

In step 604, a unit of data is transferred from the memory array buffer 224 to the asynchronous FIFO buffer 208. This unit could be any size. Referring to FIG. 4, step 604 is performed prior to the first transition of the read enable signal (following the read command), in one embodiment.

In step 606, a determination is made whether the asynchronous FIFO buffer 208 is full (in step 606). This test can be made in a number of ways. In one embodiment, the asynchronous FIFO buffer 208 provides one or more status flags. As one example, a status flag of STATUS=FULL is provided to control logic 206.

If the FIFO 208 is not yet full, the process returns to step 604 to write another unit of data to the asynchronous FIFO buffer 208. If it is determined that the asynchronous FIFO buffer 208 is full, then pre-fetching is halted. The process of pre-fetching then concludes.

Note that as soon as data is removed from the asynchronous FIFO buffer 208, additional data can be written. However, writing this additional data to the asynchronous FIFO buffer 208 typically occurs after the RE signal has been received. Thus, for the sake of discussion, the data written to the asynchronous FIFO buffer 208 after the RE signal has been received will not be referred to as "pre-fetching."

Figure 7:
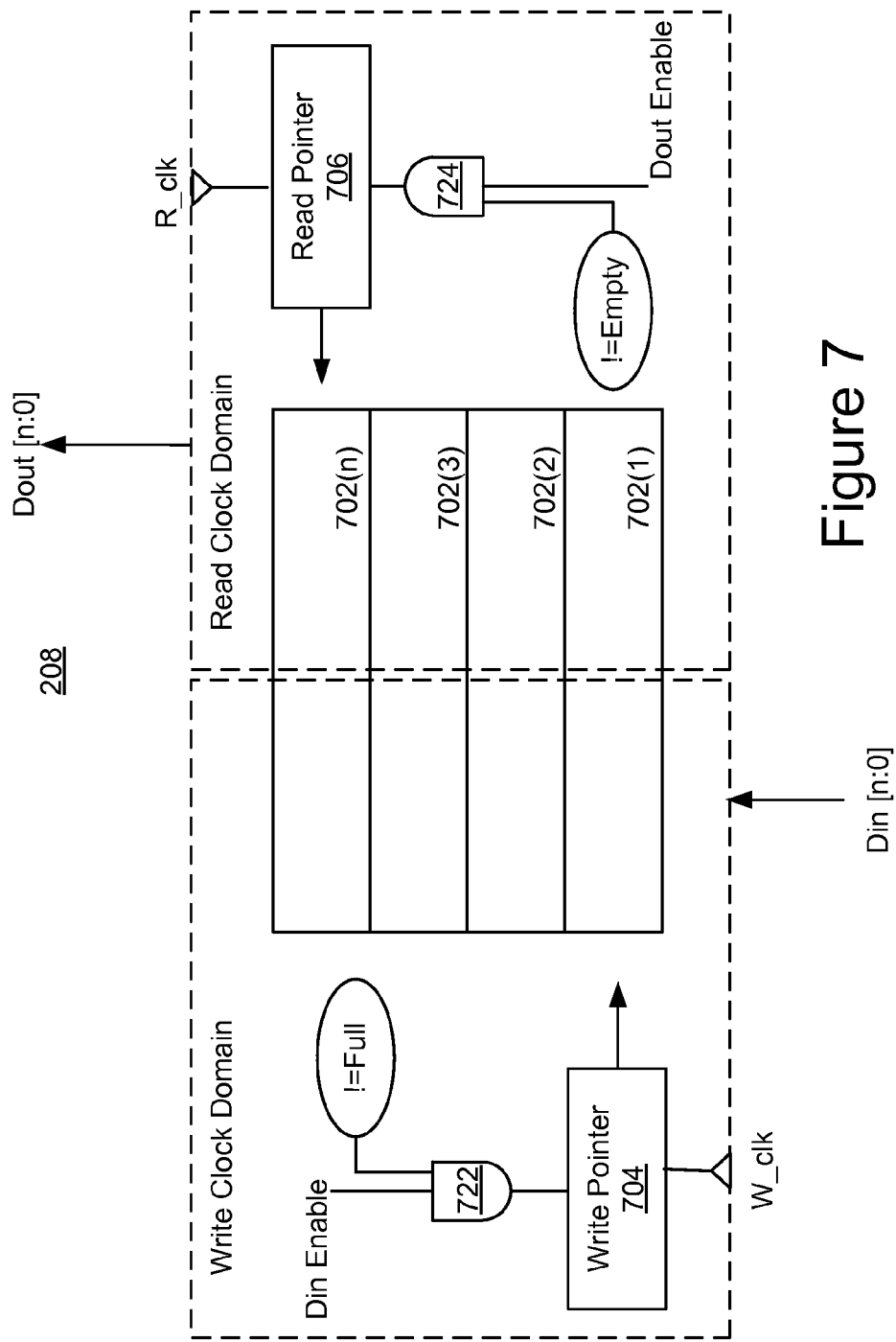
FIG. 7 is a diagram of one embodiment of an asynchronous FIFO buffer.

FIG. 7 is a diagram of one embodiment of the asynchronous FIFO buffer 208. The FIFO 208 includes several storage elements 702(1)-704(n). There could be any number of storage elements. The storage elements 702 could be implemented in a variety of ways such as registers. The storage elements may each store, for example, 8 bits, 16 bits, 32 bits, etc.

The write pointer 704 may also be referred to as a write address register. The write pointer 704 may store the address (e.g., storage element 702) to which the next data is to be written or pushed (from Din [n:0]). The read pointer 706 may also be referred to as a read address register. The read pointer 706 may store the address from which the next data is to be read or popped (onto Dout [n:0]). Thus, data that is received at Din may be stored into the storage element 702 presently pointed to by the write pointer 704. Similar, the data to be provided at Dout may be taken from the storage element 702 to which the read pointer 706 presently points.

The write clock domain represents conceptually how the write pointer 704 may be changed (e.g., incremented) in response to the write clock, as well as control signals. In this example, the asynchronous FIFO buffer 208 keeps track of whether the buffer is full. AND gate 722 inputs the Din Enable signal and a not (!) full signal. The output of AND gate 722 controls the write pointer 704. That is, so long as the write input is enabled and the asynchronous FIFO buffer 208 is not full, the write pointer 704 responds to the write clock.

The read clock domain represents conceptually how the read pointer 706 may be changed (e.g., incremented) in response to the read clock, as well as control signals. In this example, the asynchronous FIFO buffer 208 keeps track of whether the buffer is empty. AND gate 724 inputs the Dout Enable signal and a not empty signal. The output of AND gate 724 controls the read pointer 706. That is, as long as the read output is enabled and the asynchronous FIFO buffer 208 is not empty, the read pointer 706 response to the read clock. In one embodiment, the FIFO 208 synchronizes the read pointer 706 and write pointer 204 to each other, thus being able to successfully manage the buffer content without underflow or overflow conditions.

The asynchronous FIFO buffer 208 may generate status flags, such as, but not limited to, FULL, EMPTY, ALMOST FULL, ALMOST EMPTY, HALF FULL, ¾ FULL, ¾ EMPTY. It is not required that all of these status flags be generated. These status flags are generated based on the relative positions of the write pointer 704 and read pointer 706, in one embodiment.

In one embodiment, the data from the Din input goes to whatever storage element 702 the write pointer 704 currently points to. Likewise, the data is always from whatever storage element 702 the read pointer 706 presently points to. In such an embodiment, the data need not be propagated through the FIFO 208 from one storage element 702 to the next.

In one embodiment, data is always input to the same storage element 702, which may be designated as an input element. Likewise, the data may always be output from the same storage element 702, which may be designated as an output element. In such an embodiment, the data may be propagated sequentially through the FIFO 208 from one storage element to the next. As one possible implementation, as each new unit of data is received, data is shifted further down the FIFO 208.

Figure 8:
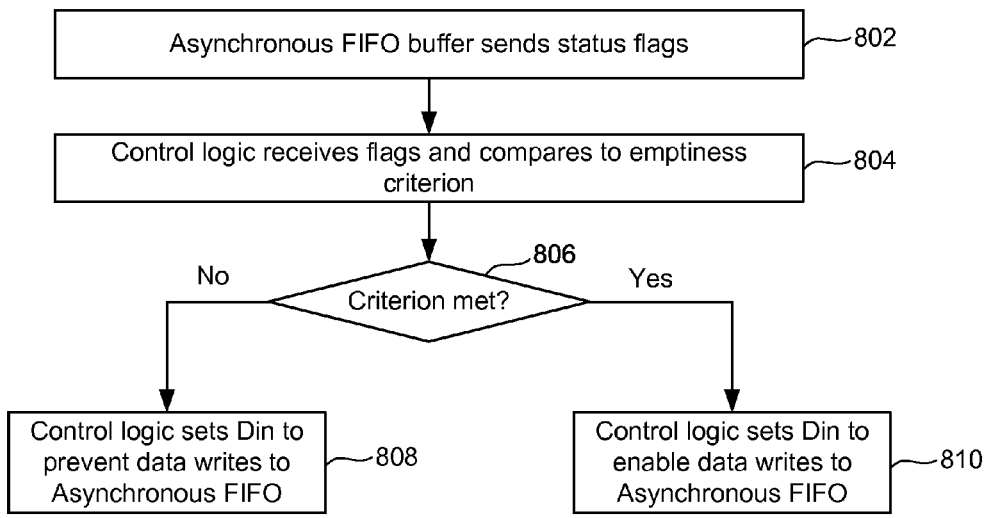
FIG. 8 is a diagram of one embodiment of transferring data to the asynchronous FIFO buffer based on a fullness state of the asynchronous FIFO buffer.

FIG. 8 is a diagram of one embodiment of transferring data to the asynchronous FIFO buffer 208 based on a fullness state of the asynchronous FIFO buffer 208. In step 802, the asynchronous FIFO buffer 208 provides status flags to the control logic 206. In one embodiment, this is based on the write pointer 704 and the read pointer 706. In one embodiment, the asynchronous FIFO buffer 208 outputs the one or more status flags.

In step 804, the control logic 206 accesses the status flag(s) and compares the flag(s) to a criterion or multiple criteria. As one example, the control logic 206 looks for whether a particular flag such as HALF EMPTY, or ALMOST EMPTY, etc. Any other condition could be used.

If the status condition is met (step 806=yes), then the control logic 206 sends a signal to the asynchronous FIFO buffer 208 that allows data writes to the asynchronous FIFO buffer 208. For example, the asynchronous FIFO buffer 208 may have a "Din enable". In effect, this serves as a write enable to the asynchronous FIFO buffer 208.

If the status condition is not met (step 806=no), then the control logic 206 sends a signal to the asynchronous FIFO buffer 208 that prevents data writes to the asynchronous FIFO buffer 208. For example, the control logic 206 sends a suitable signal to the Din enable of Din enable that prevents it from receiving data.

Figure 9:
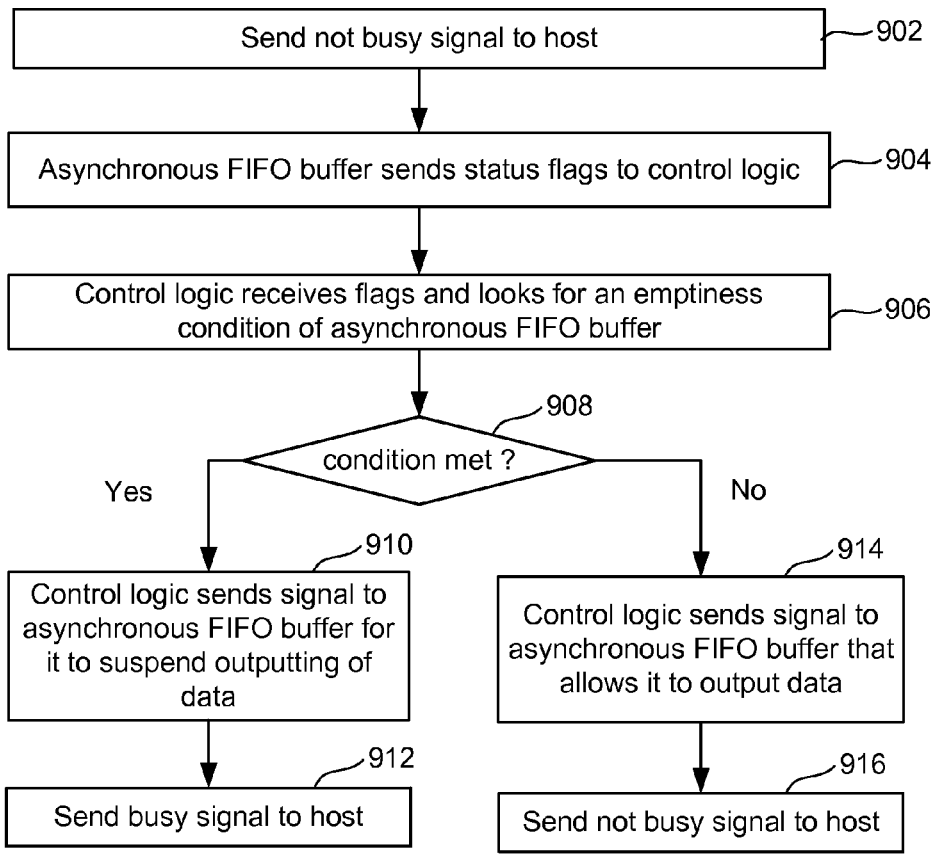
FIG. 9 is a diagram of one embodiment of preventing data output from the asynchronous FIFO buffer based on an emptiness condition of the asynchronous FIFO buffer.

FIG. 9 is a diagram of one embodiment of outputting data from the asynchronous FIFO buffer 208 based on an emptiness state of the asynchronous FIFO buffer 208. In step 902, the memory chip 202 sends a not busy signal to the controller 205 (or other host) on the read/busy interface 228.

In step 904, the asynchronous FIFO buffer 208 provides status flags to the control logic 206. In one embodiment, this is based on the write pointer 704 and the read pointer 706. In one embodiment, the asynchronous FIFO buffer 208 outputs the one or more status flags.

In step 906, the control logic 206 accesses the status flag(s) and compares the flag(s) to a criterion or multiple criteria. As one example, the control logic 206 looks for whether a particular flag such as ¾ EMPTY, ALMOST EMPTY, etc. Any other condition could be used.

If the status condition is met (step 908=yes), then the control logic 206 sends a signal to the asynchronous FIFO buffer 208 that suspends data reads from the asynchronous FIFO buffer 208. For example, the asynchronous FIFO buffer 208 may have a "Dout enable". In effect, this serves as a read enable from the asynchronous FIFO buffer 208. Note that this step allows the memory chip 202 to determine internally that an underflow condition is present. Thus, no external intervention is required. Then, in step 912, the memory chip 202 sends a busy signal on the read/busy interface 228.

If the status condition is not met (step 908=no), then the control logic 206 sends a signal to the asynchronous FIFO buffer 208 that allows data reads to the asynchronous FIFO buffer 208, in step 914. For example, the control logic 206 sends a suitable signal to the Dout enable of Din enable that allows it to output data. In step 916, the memory chip 202 sends a not busy signal on the read/busy interface 228. Thus step may simply be maintaining the not busy signal already being sent.

After either step 912 or 914, the process may return to step 904 to again process status flags from the asynchronous FIFO buffer 208. If the status changes, suitable actions are taken in steps 910-916.

Figure 10:
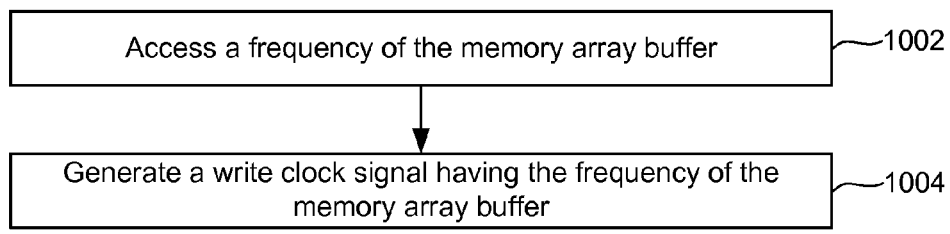
FIG. 10 is a diagram of one embodiment matching a write clock to a memory array buffer frequency.

FIG. 10 is a flowchart of one embodiment of a process of matching a frequency of the asynchronous FIFO buffer write clock to a frequency of the memory array buffer 224. In one embodiment, the memory array buffer 224 is referred to as a page register. In step 1002, an operating frequency of the memory array buffer 224 is accessed. This is for the fastest read access of the memory array buffer 224, in one embodiment.

In step 1004, the oscillator 316 generates a clock signal that matches the operating frequency of the memory array buffer 224. This clock signal is provided to the asynchronous FIFO buffer 208 at the W_clk input. For the case in which the write clock signal matches the fastest read access of the memory array buffer 224, the asynchronous FIFO buffer 208 can be written to very efficiently to help prevent underflow conditions, as well as to load the data in the asynchronous FIFO buffer 208 quickly such that latency specifications may be met.

Numerous types of memory can be used in the memory array 220. Examples include, but are not limited to, 2D NAND, 3D NAND (e.g., vertical NAND strings), and 3D ReRAM. The following are some example of various technologies that can be used with embodiments. However, embodiments are not limited to these examples.

Figure 11:
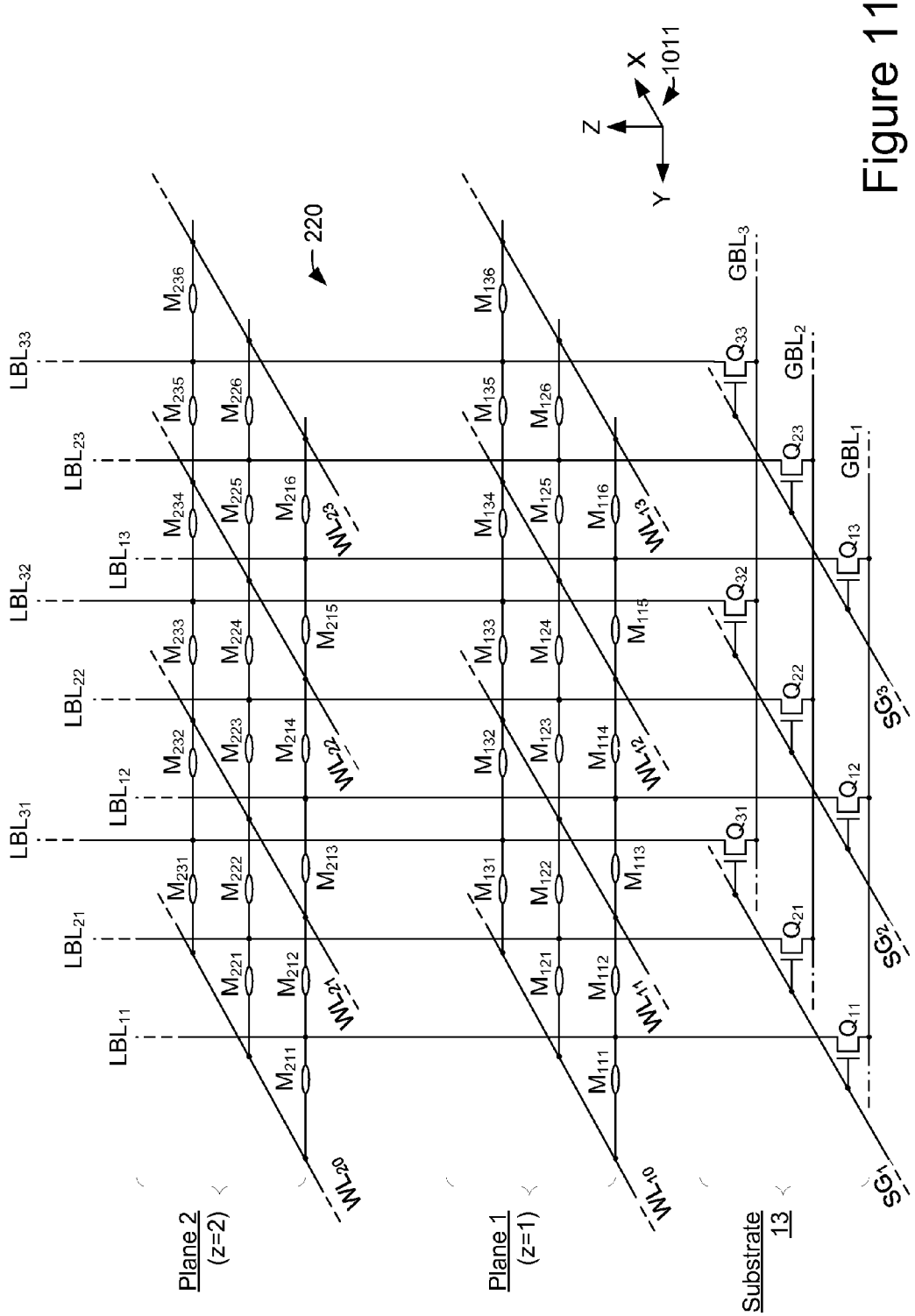
FIG. 11 is an example memory array for ReRAM.
Figure 12:
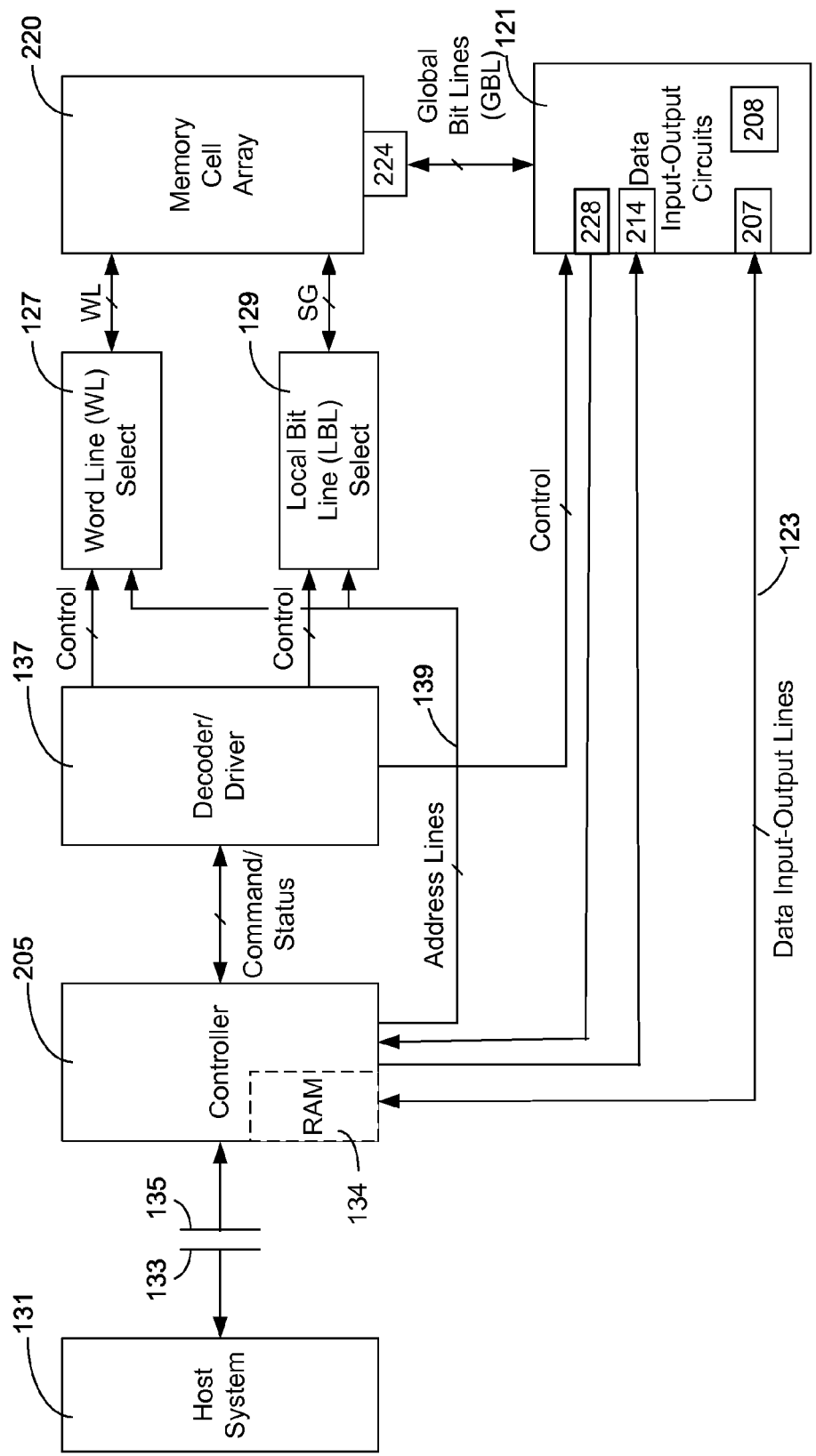
FIG. 12 is a block diagram of an illustrative memory system having one embodiment of an asynchronous FIFO buffer that can use the three-dimensional memory of FIG. 11.

For the sake of illustration, FIG. 11 and FIG. 12 are an example that pertains to ReRAM. One embodiment includes a three-dimensional array 220 of memory elements that can be set to a first state and reset to a second state during operation by biasing appropriate voltages on the word lines and bit lines. Prior to operation, the memory elements undergo a forming operation, during which current through the bit lines is limited. A forming voltage is applied to the memory elements during forming with a polarity such that a given bit line acts as a cathode and the appropriate word line acts as an anode, with the cathode having a lower electron injection energy barrier to the switching material than the anode. Such a configuration provides for a more controlled and accurate forming method that does not damage the memory device.

The memory elements used in the three-dimensional array are preferably variable resistive memory elements. That is, the resistance (and thus inversely the conductance) of the individual memory elements is typically changed as a result of a voltage placed across the orthogonally intersecting conductors to which the memory element is connected. Depending on the type of variable resistive element, the state may change in response to a voltage across it, a level of current though it, an amount of electric field across it, a level of heat applied to it, and the like. With some variable resistive element material, it is the amount of time that the voltage, current, electric field, heat and the like is applied to the element that determines when its conductive state changes and the direction in which the change takes place. In between such state changing operations, the resistance of the memory element remains unchanged, so is non-volatile. The three-dimensional array architecture summarized above may be implemented with a memory element material selected from a wide variety of such materials having different properties and operating characteristics.

The resistance of the memory element, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change in another direction. With two detectable states, each memory element stores one-bit of data. With the use of some materials, more than one bit of data may be stored in each memory element by designating more than two stable levels of resistance as detectable states of the memory element. The three-dimensional array architecture herein is quite versatile in the way it may be operated.

This three-dimensional architecture also allows limiting the extent and number of unaddressed (non-selected) resistive memory elements across which an undesired level of voltage is applied during reading and programming operations conducted on other addressed (selected) memory elements. The risk of disturbing the states of unaddressed memory elements and the levels of leakage current passing through unaddressed elements may be significantly reduced from those experienced in other arrays using the same memory element material. Leakage currents are undesirable because they can alter the apparent currents being read from addressed memory elements, thereby making it difficult to accurately read the states of addressed (selected) memory elements. Leakage currents are also undesirable because they add to the overall power draw by an array and therefore undesirably causes the power supply to have to be made larger than is desirable. Because of the relatively small extent of unaddressed memory elements that have voltages applied during programming and reading of addressed memory elements, the array with the three-dimensional architecture herein may be made to include a much larger number of addressed memory elements without introducing errors in reading and exceeding reasonable power supply capabilities.

In addition, the three-dimensional architecture herein allows variable resistance memory elements to be connected at orthogonal crossings of bit and word line conductors without the need for diodes or other non-linear elements being connected in series with the variable resistive elements. In existing arrays of variable resistance memory elements, a diode is commonly connected in series with each memory element in order to reduce the leakage current though the element when it is unselected but nevertheless has a voltage difference placed across it, such as can occur when the unselected memory element is connected to a bit or word line carrying voltages to selected memory elements connected to those same lines. The absence of the need for diodes significantly reduces the complexity of the array and thus the number of processing steps required to manufacture it. The term connected refers to direct and indirect connections.

Indeed, the manufacture of the three-dimensional array of memory elements herein is much simpler than other three-dimensional arrays using the same type of memory elements. In particular, a fewer number of masks is required to form the elements of each plane of the array. The total number of processing steps needed to form integrated circuits with the three-dimensional array are thus reduced, as is the cost of the resulting integrated circuit.

Referring initially to FIG. 11, an architecture of one example embodiment of a three-dimensional memory 220 is schematically and generally illustrated in the form of an equivalent circuit of a portion of such a memory. A standard three-dimensional rectangular coordinate system 1011 is used for reference, the directions of each of vectors x, y and z being orthogonal with the other two. In another embodiment direction x and x are substantially 60 degrees from each other.

A circuit for selectively connecting internal memory elements with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices $Q_{xy}$ having the same position in the x-direction, although during reading and also typically programming only one select device connected with a specific global bit line is turned on at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns on the select devices to which it is connected. The remaining row select lines receive voltages that keep their connected select devices $Q_{xy}$ off. It may be noted that since only one select device ($Qx_{xy}$) is used with each of the local bit lines ($LBL_{xy}$), the pitch of the array across the semiconductor substrate in both x and y-directions may be made very small, and thus the density of the memory storage elements large.

Memory elements $M_{zxy}$ are formed in a plurality of planes positioned at different distances in the z-direction above the substrate. Two planes 1 and 2 are illustrated in FIG. 11 but there will typically be more, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other above a semiconductor substrate with the local bit lines $LBL_{xy}$ being connected with storage elements $M_{zxy}$ of each plane through which the local bit lines extend.

The memory arrays described herein, including memory 220, are monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIG. 12 is a block diagram of an illustrative memory system that can use the three-dimensional memory 220 of FIG. 11. Data input-output circuits 121 are connected to provide (during programming) and receive (during reading) analog electrical quantities in parallel over the global bit-lines $GBL_x$ of FIG. 11 that are representative of data stored in addressed memory elements $M_{zxy}$. Data input-output circuits 121 typically contain sense amplifiers for converting these electrical quantities into digital data values during reading, which digital values are then conveyed over lines 123 to a memory system controller 205. Conversely, data to be programmed into the array 220 are sent by the controller 205 to the input-output circuits 121, which then programs that data into addressed memory element by placing proper voltages on the global bit lines $GBL_x$.

The input-output circuits 121 have an asynchronous FIFO buffer 208, in one embodiment. The input-output circuits 121 also have a data I/O interface 207 and a read enable interface 214. The memory cell array 220 is coupled to memory array buffer 224. The asynchronous FIFO buffer 208 may be implemented in accordance with various embodiments disclosed herein. The decoder/driver 137, word line select driver 127, local bit line select driver 129, and at least portions of data input output circuits 121 are one implementation of control logic 216 of FIGS. 2, 3A, and/or 3B.

For binary operation, one voltage level is typically placed on a global bit line to represent a binary "1" and another voltage level to represent a binary "0". The memory elements are addressed for reading or programming by voltages placed on the word lines $WL_{zy}$ and row select lines $SG_y$ by respective word line select circuits 127 and local bit line circuits 129. In the specific three-dimensional array of FIG. 11, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 127 and 129.

Controller 205 typically receives data from and sends data to a host system 131. Controller 205 usually contains an amount of random-access-memory (RAM) 134 for temporarily storing such data and operating information. Commands, status signals and addresses of data being read or programmed are also exchanged between the controller 205 and host 131. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 133 for one or more types of memory cards or flash drives that accepts a mating memory system plug 135 of the memory system but some hosts require the use of adapters into which a memory card is plugged, and others require the use of cables therebetween. Alternatively, the memory system may be built into the host system as an integral part thereof.

Controller 205 conveys to decoder/driver circuits 137 commands received from the host 131. Similarly, status signals generated by the memory system are communicated to the controller 205 from decoder/driver circuits 137. The circuits 137 can be simple logic circuits in the case where the controller controls nearly all of the memory operations, or can include a state machine to control at least some of the repetitive memory operations necessary to carry out given commands. Control signals resulting from decoding commands are applied from the circuits 137 to the word line select circuits 127, local bit line select circuits 129 and data input-output circuits 121. Also connected to the circuits 127 and 129 are address lines 139 from the controller that carry physical addresses of memory elements to be accessed within the array 102 in order to carry out a command from the host. The physical addresses correspond to logical addresses received from the host system 131, the conversion being made by the controller 205 and/or the decoder/driver 137. As a result, the local bit line select e circuits 129 partially address the designated storage elements within the array 102 by placing proper voltages on the control elements of the select devices $Q_{xy}$ to connect selected local bit lines ($LBL_{xy}$) with the global bit lines ($GBL_x$). The addressing is completed by the circuits 127 applying proper voltages to the word lines $WL_{zy}$ of the array. In one embodiment, any one or combination of Controller 205, decoder/driver circuits 137, circuits 121, 127 and 129, or other control logic can be referred to as one or more control circuits.

Figure 13:
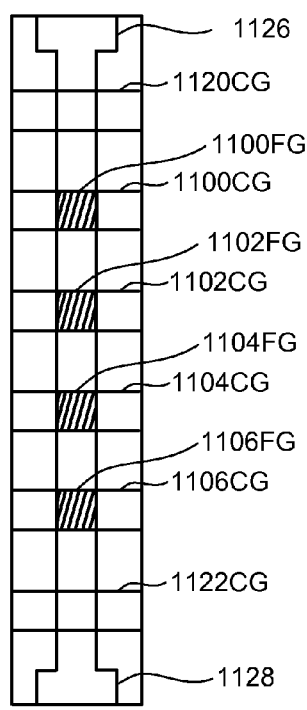
FIG. 13 is a top view showing one NAND string.
Figure 14:
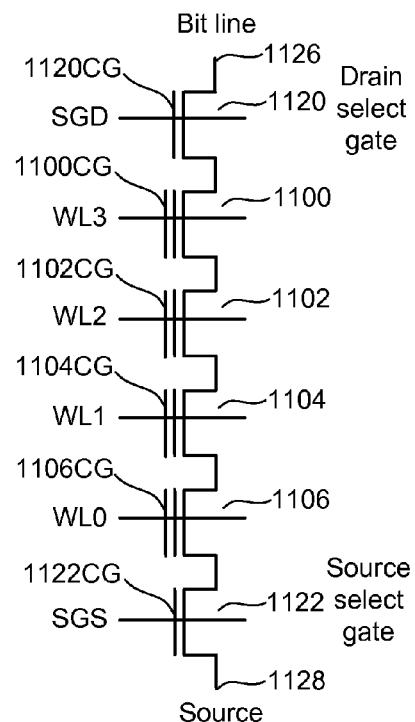
FIG. 14 is an equivalent circuit thereof.

One example of a memory system suitable for implementing embodiments of the present invention uses the NAND flash memory structure, which includes arranging multiple transistors in series between two select gates. The transistors in series and the select gates are referred to as a NAND string. FIG. 13 is a top view showing one NAND string. FIG. 14 is an equivalent circuit thereof. The NAND string depicted in FIGS. 13 and 14 includes four transistors, 1100, 1102, 1104 and 1106, in series and sandwiched between a first select gate 1120 and a second select gate 1122. Select gate 1120 gates the NAND string connection to bit line 1126. Select gate 1122 gates the NAND string connection to source line 1128. Select gate 1120 is controlled by applying the appropriate voltages to control gate 1120CG. Select gate 1122 is controlled by applying the appropriate voltages to control gate 1122CG. Each of the transistors 1100, 1102, 1104 and 1106 has a control gate and a floating gate. Transistor 1100 has control gate 1100CG and floating gate 1100FG. Transistor 1102 includes control gate 1102CG and floating gate 1102FG. Transistor 1104 includes control gate 1104CG and floating gate 1104FG. Transistor 1106 includes a control gate 1106CG and floating gate 1106FG. Control gate 1100CG is connected to word line WL3, control gate 1102CG is connected to word line WL2, control gate 1104CG is connected to word line WL1, and control gate 1106CG is connected to word line WL0. The control gates can also be provided as portions of the word lines. In one embodiment, transistors 1100, 1102, 1104 and 1106 are each storage elements, also referred to as memory cells. In other embodiments, the storage elements may include multiple transistors or may be different than that depicted in FIGS. 13 and 14. Select gate 1120 is connected to select line SGD (drain select gate). Select gate 1122 is connected to select line SGS (source select gate).

Figure 15:
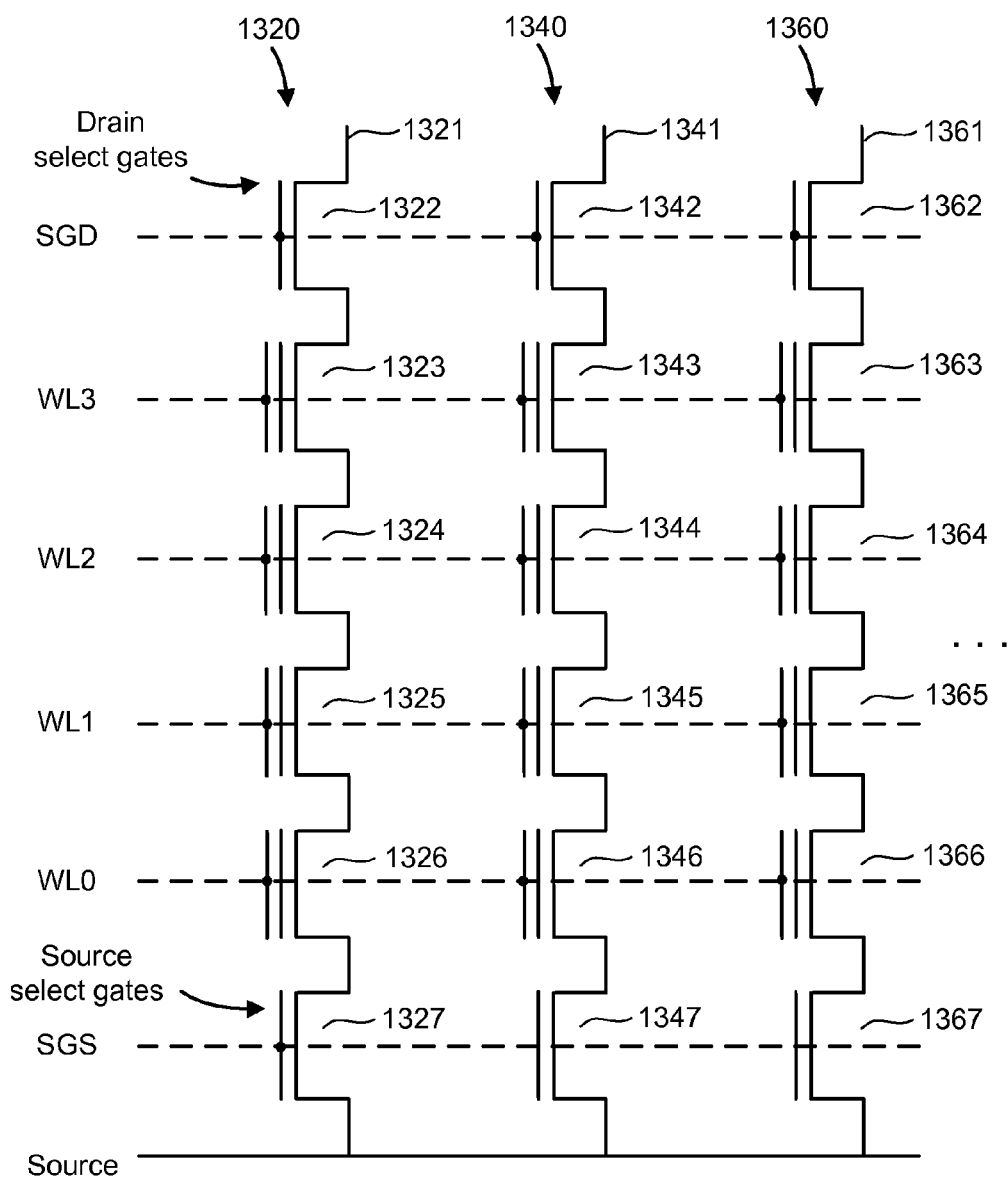
FIG. 15 is a circuit diagram depicting three NAND strings.

FIG. 15 is a circuit diagram depicting three NAND strings. A typical architecture for a flash memory system using a NAND structure will include many NAND strings. For example, three NAND strings 1320, 1340 and 1360 are shown in a memory array having many more NAND strings. Each of the example NAND strings includes two select gates and four storage elements. While four storage elements are illustrated for simplicity, modern NAND strings can have thirty-two, sixty-four storage elements, or some other number of storage elements, for instance.

For example, NAND string 1320 includes select gates 1322 and 1327, and storage elements 1323-1326, NAND string 1340 includes select gates 1342 and 1347, and storage elements 1343-1346, NAND string 1360 includes select gates 1362 and 1367, and storage elements 1363-1366. Each NAND string is connected to the source line by its select gates (e.g., select gates 1327, 1347 or 1367). A selection line SGS is used to control the source side select gates. The various NAND strings 1320, 1340 and 1360 are connected to respective bit lines 1321, 1341 and 1361, by select transistors in the select gates 1322, 1342, 1362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 1323, 1343 and 1363. Word line WL2 is connected to the control gates for storage elements 1324, 1344 and 1364. Word line WL1 is connected to the control gates for storage elements 1325, 1345 and 1365. Word line WL0 is connected to the control gates for storage elements 1326, 1346 and 1366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 1324, 1344 and 1364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Pat. No. 7,237,074, both of which are incorporated herein by reference in their entirety, describe various data encoding schemes for multi-state flash storage elements.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 1324 of FIG. 15, the program voltage will also be applied to the control gates of storage elements 1344 and 1364.

Figure 16:
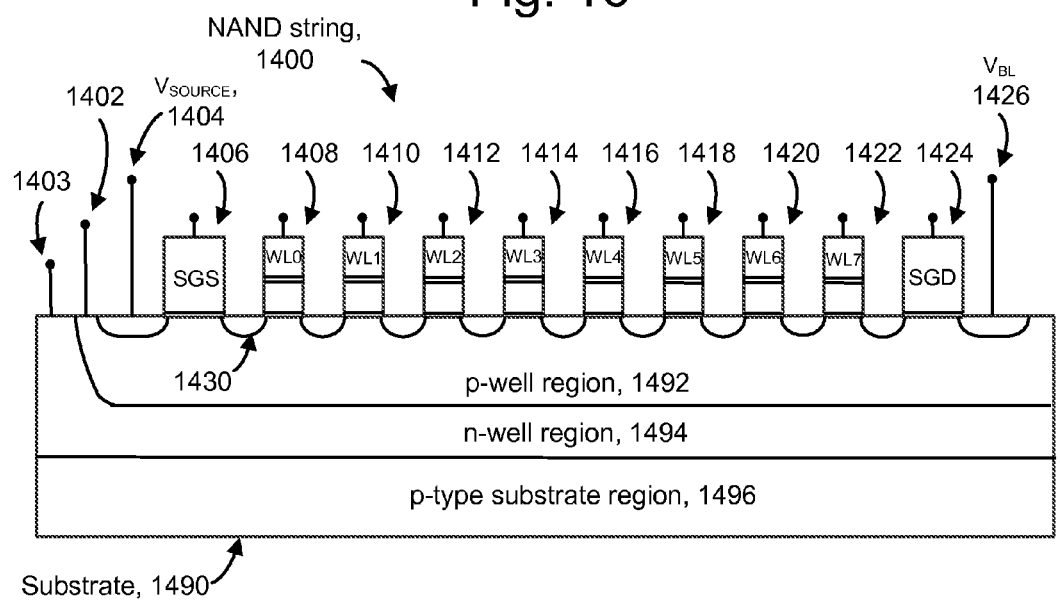
FIG. 16 depicts a cross-sectional view of an NAND string formed on a substrate.

FIG. 16 depicts a cross-sectional view of an NAND string formed on a substrate. The view is simplified and not to scale. The NAND string 1400 includes a source-side select gate 1406, a drain-side select gate 1424, and eight storage elements 1408, 1410, 1412, 1414, 1416, 1418, 1420 and 1422, formed on a substrate 1490. A number of source/drain regions, one example of which is source drain/region 1430, are provided on either side of each storage element and the select gates 1406 and 1424. In one approach, the substrate 1490 employs a triple-well technology which includes a p-well region 1492 within an n-well region 1494, which in turn is within a p-type substrate region 1496. The NAND string and its non-volatile storage elements can be formed, at least in part, on the p-well region. A source supply line 1404 with a potential of $V_{SOURCE}$ is provided in addition to a bit line 1426 with a potential of $V_{BL}$. In one possible approach, a voltage can be applied to the p-well region 1492 via a terminal 1402. A voltage can also be applied to the n-well region 1494 via a terminal 1403.

During a read or verify operation, including an erase-verify operation, in which the condition of a storage element, such as its threshold voltage, is ascertained, $V_{CGR}$ is provided on a selected word line which is associated with a selected storage element. Further, recall that the control gate of a storage element may be provided as a portion of the word line. For example, WL0, WL1, WL2, WL3, WL4, WL5, WL6 and WL7 can extend via the control gates of storage elements 1408, 1410, 1412, 1414, 1416, 1418, 1420 and 1422, respectively. A read pass voltage, $V_{READ}$, can be applied to unselected word lines associated with NAND string 1400, in one possible boosting scheme. Other boosting schemes apply $V_{READ}$ to some word lines and lower voltages to other word lines. $V_{SGS}$ and $V_{SGD}$ are applied to the select gates 1406 and 1424, respectively.

Figure 17:
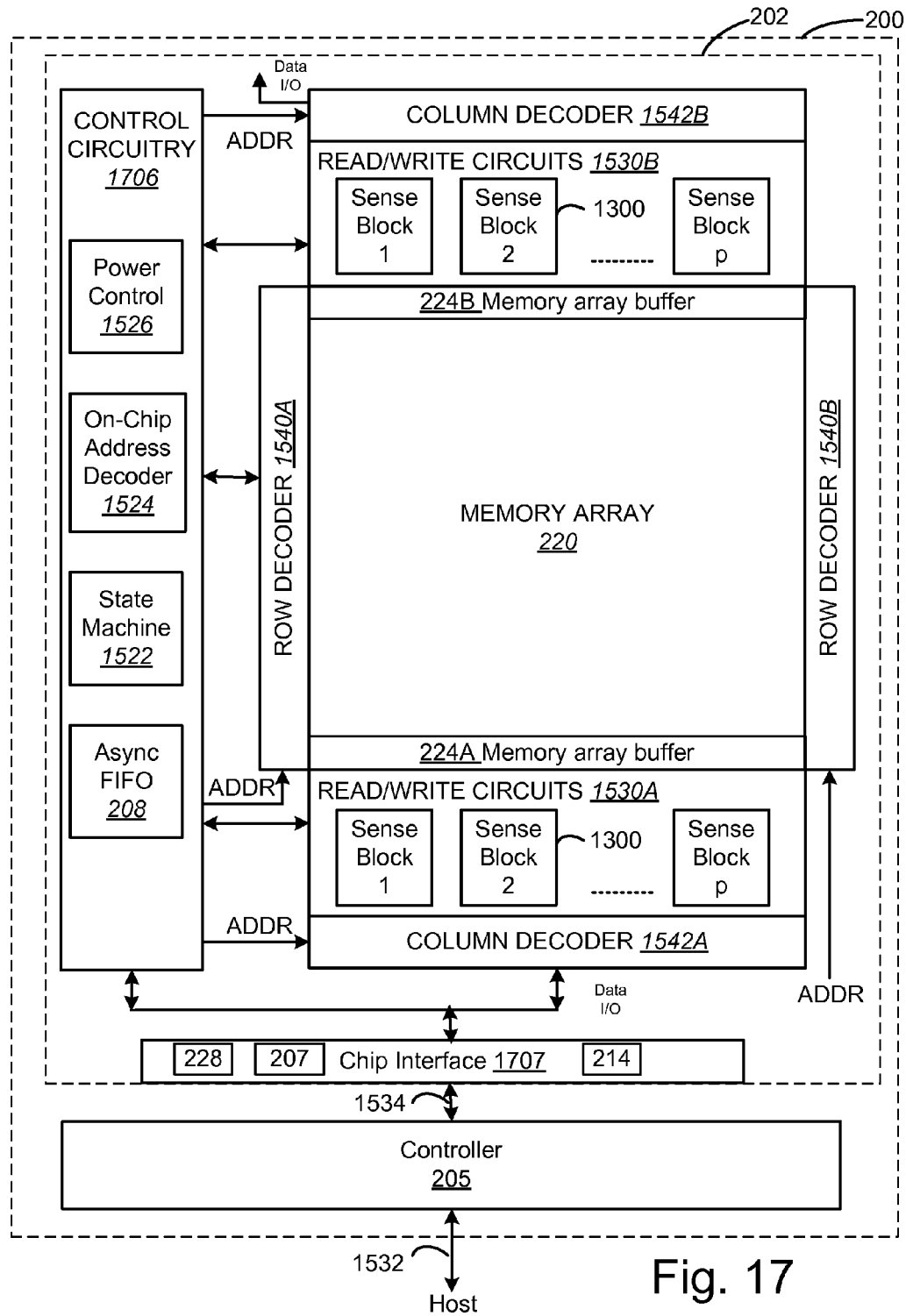
FIG. 17 illustrates one embodiment of a non-volatile storage device that may include one or more memory die or chips having an asynchronous FIFO.

FIG. 17 illustrates one embodiment of a non-volatile storage device 200 that may include one or more memory die or chips 202 having an asynchronous FIFO 208. Memory die 202 includes an array (two-dimensional or three dimensional) of memory cells 220, control circuitry 1706, and read/write circuits 1530A and 1530B. The memory cells are 2D NAND in one embodiment. The memory cells are 3D NAND in one embodiment. 3D NAND may have vertical NAND strings. In one embodiment, the memory cells have floating gates.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semiconductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

In one embodiment, access to the memory array 220 by the various peripheral circuits is implemented in a symmetric fashion, on opposite sides of the array, so that the densities of access lines and circuitry on each side are reduced by half. The read/write circuits 1530A and 1530B include multiple sense blocks 1300 which allow a page of memory cells to be read or programmed in parallel. The memory array 220 is addressable by word lines via row decoders 1540A and 1540B and by bit lines via column decoders 1542A and 1542B. In a typical embodiment, a controller 205 is included in the same memory device 200 (e.g., a removable storage card or package) as the one or more memory die 202. Commands and data are transferred between the host and controller 205 via lines 1532 and between the controller and the one or more memory die 202 via lines 1534. One implementation can include multiple chips 202.

The memory die 202 has a chip interface 1707, which provides a way to access the memory array 220. The chip interface 1707 includes at least a data I/O interface 207 and a read enable interface 207. There may also be a ready/busy interface 228. These may be pins, pads, etc. There may be many more pins (or pads) in the chip interface 1707.

The memory die 202 has an asynchronous FIFO buffer 208. This is depicted in the control circuitry 1706 as a matter of convenience. The diagram is not intended to show precise physical locations of various elements. The asynchronous FIFO buffer 208 may be implemented in accordance with various embodiments disclosed herein.

The memory array 220 is connected to a memory array buffers 224A and 224B, in one embodiment. All or portions of the control circuitry 1706, column decoder 1524, read/write circuits 1530, and row decoder 1540 are one embodiment of control logic 206 of FIGS. 2, 3A, and/or 3B.

Control circuitry 1706 cooperates with the read/write circuits 1530A and 1530B to perform memory operations on the memory array 220. The control circuitry 1706 includes a state machine 1522, an on-chip address decoder 1524 and a power control module 1526. The state machine 1522 provides chip-level control of memory operations. The on-chip address decoder 1524 provides an address interface to convert between the address that is used by the host or a memory controller to the hardware address used by the decoders 1540A, 1540B, 1542A, and 1542B. The power control module 1526 controls the power and voltages supplied to the word lines and bit lines during memory operations. In one embodiment, power control module 1526 includes one or more charge pumps that can create voltages larger than the supply voltage.

In one embodiment, one or any combination of control circuitry 1706, power control circuit 1526, decoder circuit 1524, state machine circuit 1522, decoder circuit 1542A, decoder circuit 1542B, decoder circuit 1540A, decoder circuit 1540B, read/write circuits 1530A, read/write circuits 1530B, and/or controller 205 can be referred to as one or more managing circuits.

One embodiment includes a non-volatile storage device, comprising a memory array, a data interface, a read enable interface that receives a read enable signal, an asynchronous first-in first-out (FIFO) buffer, and control logic. The read enable signal defines how data to be read from the memory array should be clocked out of the non-volatile storage device on the data interface. The asynchronous first-in first-out (FIFO) buffer is coupled to the data interface, the read enable interface, and the memory array. The asynchronous FIFO buffer has a read clock input and a write clock input. The read clock input receives the read enable signal. The write clock input receives a write clock that is asynchronous from the read enable signal. The asynchronous FIFO buffer inputs data from the memory array in accordance with the write clock signal. The asynchronous FIFO buffer outputs data in accordance with the read enable signal. The control logic pre-fetches data from the memory array into the asynchronous FIFO buffer prior to the read enable signal first being received on the read enable interface following a read command to read the data from the memory array. The control logic provides the data output from the asynchronous FIFO buffer onto the data interface.

One embodiment includes a method of operating non-volatile storage device comprising the following. A command to read data from a memory array of the non-volatile storage device is received. An address of the data to be read from the memory array is received. Data from the memory array is pre-fetched into an asynchronous first-in first-out (FIFO) buffer in accordance with the address. A read enable signal is received on a read enable interface of the non-volatile storage device. The read enable signal defines how the data to be read should be clocked on to a data interface of the non-volatile storage device. The pre-fetching data occurs prior to first receiving the read enable signal following the read command. The read enable signal is provided to the asynchronous FIFO buffer. Data is output from the asynchronous FIFO buffer in accordance with the read enable signal provided to the asynchronous FIFO buffer. A write clock signal is received at the asynchronous FIFO buffer. The write clock signal is asynchronous from the read enable signal that is received at the asynchronous FIFO buffer. Data from the memory array is provided to the asynchronous FIFO buffer in accordance with the write clock signal. The data that is output from the asynchronous FIFO buffer is provided to the data interface of the non-volatile storage device.

One embodiment includes a non-volatile storage device, comprising a memory die having a memory array, a page register coupled to the memory array, a data input/output (I/O) interface, a read enable interface, control logic, and an asynchronous first-in first-out (FIFO) buffer coupled to the data I/O interface, the read enable interface, the page register, and the control logic. The control logic receives a read command and an address from the data I/O interface, the address is for data to be read from the memory array. The control logic reads the memory array at the address and temporarily stores the data that is accessed from the memory array in the page register. The control logic pre-fetches portions of the data from the page register into the asynchronous FIFO buffer prior to a read enable signal first being received on the read enable interface following the read command. The FIFO has a read pointer, a write pointer, a read clock input that receives the read enable signal from the read enable interface, a write clock input that receives a write clock that is asynchronous from the read enable signal. The read pointer points to a location of data in the asynchronous FIFO buffer to be output in accordance with the read enable signal. The write pointer points to a location of data in the asynchronous FIFO buffer to write from the page register in accordance with the write clock. The control logic transfers data that is output from the asynchronous FIFO buffer onto the data I/O interface.

One embodiment includes a 3D non-volatile storage device. The 3D non-volatile storage device has a 3D memory array having variable resistive memory cells, a data interface, a read enable interface, an asynchronous first-in first-out (FIFO) buffer, and control logic. The read enable interface receives a read enable signal, the read enable signal defines how data to be read from the memory array should be clocked out of the non-volatile storage device on the data interface. The asynchronous first-in first-out (FIFO) buffer is coupled to the data interface, the read enable interface, and the memory array. The asynchronous FIFO buffer has a read clock input and a write clock input. The read clock input receives the read enable signal, the write clock input receives a write clock that is asynchronous from the read enable signal, the asynchronous FIFO buffer inputs data from the memory array in accordance with the write clock signal, the asynchronous FIFO buffer outputs data in accordance with the read enable signal. The control logic pre-fetches data from the memory array into the asynchronous FIFO buffer prior to the read enable signal first being received on the read enable interface following a read command to read the data from the memory array. The control logic provides the data output from the asynchronous FIFO buffer onto the data interface.

The foregoing detailed description has been presented for purposes of illustration and description. It is not intended to be exhaustive or limiting to the precise form disclosed. Many modifications and variations are possible in light of the above teaching. The described embodiments were chosen in order to best explain the principles of the disclosed technology and its practical application, to thereby enable others skilled in the art to best utilize the technology in various embodiments and with various modifications as are suited to the particular use contemplated. It is intended that the scope be defined by the claims appended hereto.

What is claimed is:

1. A non-volatile storage device, comprising:
   a memory array;
   a data interface;
   a read enable interface configured to receive a read enable signal, wherein the read enable signal defines how data to be read from the memory array should be clocked out of the non-volatile storage device on the data interface;
   an asynchronous first-in first-out (FIFO) buffer coupled to the data interface, the read enable interface, and the memory array, wherein the asynchronous FIFO buffer comprises a read clock input and a write clock input, wherein the read clock input is configured to receive the read enable signal, wherein the write clock input is configured to receive a write clock, wherein the write clock is a delayed version of the read enable signal that is asynchronous to the read enable signal provided to the read clock input, wherein the asynchronous FIFO buffer is configured to input data from the memory array in accordance with the write clock, wherein the asynchronous FIFO buffer is configured to output data in accordance with the read enable signal; and
   control logic configured to provide the data output from the asynchronous FIFO buffer onto the data interface.

2. The non-volatile storage device of claim 1, wherein the control logic is configured to suspend output of data from the asynchronous FIFO buffer in response to detecting an emptiness condition of the asynchronous FIFO buffer.

3. The non-volatile storage device of claim 1, wherein the control logic is configured to:
   detect an emptiness condition of the asynchronous FIFO buffer; and
   prevent data from the memory array from being input to the asynchronous FIFO buffer if the emptiness condition is not met.

4. The non-volatile storage device of claim 1, wherein the non-volatile storage device comprises a memory die and a memory controller;
   wherein the memory array and the asynchronous FIFO buffer are on the memory die, wherein the data interface and the read enable interface are part of interface between the memory die and the memory controller.

5. The non-volatile storage device of claim 1, wherein the memory array is a 3D memory array.

6. The non-volatile storage device of claim 4, wherein the memory die further comprises a page register coupled to the memory array, wherein the control logic is configured to:
   receive a read command and an address for data to be read from the memory array;
   read the memory array at the address and temporarily store the data that is accessed from the memory array in the page register; and
   pre-fetch portions of the data from the page register into the asynchronous FIFO buffer prior to a read enable signal first being received on the read enable interface following the read command.

7. The non-volatile storage device of claim 6, wherein the asynchronous FIFO comprises a read pointer and a write pointer, wherein the read pointer points to a location of data in the asynchronous FIFO buffer to be output in accordance with the read enable signal, wherein the write pointer points to a location of data in the asynchronous FIFO buffer to write from the page register in accordance with the write clock.

8. The non-volatile storage device of claim 1, wherein the control logic is further configured to pre-fetch data from the memory array into the asynchronous FIFO buffer prior to the read enable signal first being received on the read enable interface following a read command to read the data from the memory array.

9. The non-volatile storage device of claim 8, wherein the control logic is further configured to:
   transfer data from the memory array to a memory array buffer in response to receiving the read command and an address of data to be read from the memory array; and
   pre-fetch portions of the data from the memory array buffer into the asynchronous FIFO buffer prior to a first transition of the read enable signal on the read enable interface following the read command.

10. A method of operating non-volatile storage device, comprising:
   receiving a command to read data from a memory array of the non-volatile storage device;
   receiving an address of the data to be read from the memory array;
   receiving a read enable signal on a read enable interface of the non-volatile storage device, wherein the read enable signal defines how the data to be read should be clocked on to a data interface of the non-volatile storage device;
   providing the read enable signal to an asynchronous first-in-first-out (FIFO) buffer;
   outputting data from the asynchronous FIFO buffer in accordance with the read enable signal provided to the asynchronous FIFO buffer;
   receiving a write clock signal at the asynchronous FIFO buffer, wherein the write clock signal is a delayed version of the read enable signal and is asynchronous from the read enable signal that is received at the asynchronous FIFO buffer;
   inputting data from the memory array to the asynchronous FIFO buffer in accordance with the write clock signal; and
   providing the data that is output from the asynchronous FIFO buffer to the data interface of the non-volatile storage device.

11. The method of claim 10, wherein the inputting data from the memory array to the asynchronous FIFO buffer in accordance with the write clock signal comprises:
   detecting an emptiness condition of the asynchronous FIFO buffer; and
   preventing data from being input to the asynchronous FIFO buffer if the emptiness condition is not met.

12. The method of claim 10, wherein the outputting data from the asynchronous FIFO buffer in accordance with the read enable signal provided to the asynchronous FIFO buffer comprises:
   detecting an emptiness condition of the asynchronous FIFO buffer; and
   suspending the outputting of data from the asynchronous FIFO buffer in response to detecting the emptiness condition.

13. The method of claim 10, further comprising:
   pre-fetching data from the memory array into an asynchronous first-in first-out (FIFO) buffer in accordance with the address, wherein the pre-fetching data occurs prior to first receiving the read enable signal following the read command.

14. The method of claim 13, wherein the pre-fetching data from the memory array into the asynchronous FIFO buffer comprises:
   transferring data from the memory array to a memory array buffer in response to receiving an address of data to be read from the memory array; and
   pre-fetching portions of the data from the memory array buffer into the asynchronous FIFO buffer prior to the read enable signal first being received on the read enable interface.

15. A non-volatile storage device, comprising:
   a 3D memory array having variable resistive memory cells;
   a data interface;
   a read enable interface that receives a read enable signal, wherein the read enable signal defines how data to be read from the memory array should be clocked out of the non-volatile storage device on the data interface;
   an asynchronous first-in first-out (FIFO) buffer coupled to the data interface, the read enable interface, and the memory array, the asynchronous FIFO buffer having a read clock input and a write clock input, wherein the read clock input receives the read enable signal, wherein the write clock input receives a write clock that is asynchronous from the read enable signal, wherein the write clock is a delayed version of the read enable signal, wherein the asynchronous FIFO buffer inputs data from the memory array in accordance with the write clock, wherein the asynchronous FIFO buffer outputs data in accordance with the read enable signal; and
   control logic that provides the data output from the asynchronous FIFO buffer onto the data interface.

16. A non-volatile storage device comprising:
   means for receiving a command to read data from a memory array of the non-volatile storage device;
   means for receiving an address of the data to be read from the memory array;
   means for receiving a read enable signal on a read enable interface of the non-volatile storage device, the read enable signal defines how the data to be read should be clocked on to a data interface of the non-volatile storage device;
   means for providing the read enable signal to the asynchronous FIFO buffer;
   means for outputting data from the asynchronous FIFO buffer in accordance with the read enable signal provided to the asynchronous FIFO buffer;
   means for receiving a write clock signal at the asynchronous FIFO buffer, wherein the write clock signal is a delayed version of the read enable signal and is asynchronous from the read enable signal that is received at the asynchronous FIFO buffer;
   means for inputting data from the memory array to the asynchronous FIFO buffer in accordance with the write clock signal; and
   means for providing the data that is output from the asynchronous FIFO buffer to the data interface of the non-volatile storage device.

* * * * *